United States Patent
Kubo et al.

[11] Patent Number: 5,656,798
[45] Date of Patent: Aug. 12, 1997

[54] TERMINAL-CARRYING CIRCUIT BOARD

[75] Inventors: Masao Kubo; Kazuo Kamada; Masanobu Ogasawara; Yoshimitsu Nakamura, all of Kadoma, Japan

[73] Assignee: Matsushita Electric Works, Ltd., Osaka, Japan

[21] Appl. No.: 574,855

[22] Filed: Dec. 19, 1995

Related U.S. Application Data

[62] Division of Ser. No. 120,429, Sep. 14, 1993, Pat. No. 5,497,546.

[30] Foreign Application Priority Data

Sep. 21, 1992 [JP] Japan ................... 4-276580

[51] Int. Cl.⁶ .................................. H05K 1/02
[52] U.S. Cl. .................. 174/265; 174/266; 174/263; 439/82
[58] Field of Search ..................... 174/262, 263, 174/264, 265, 266; 257/694, 739, 734; 361/772, 773, 774; 439/45, 46, 75, 81, 82, 83, 84

[56] References Cited

U.S. PATENT DOCUMENTS

| | | | |
|---|---|---|---|
| 3,133,773 | 5/1964 | Ecker | 339/17 |
| 3,268,652 | 8/1966 | Burns et al. | 174/68.5 |
| 3,524,960 | 8/1970 | Lohff | 200/155 |
| 3,880,486 | 4/1975 | Arakian | 339/17 M |
| 3,964,813 | 6/1976 | Pizzeck | 339/17 M |
| 4,319,121 | 3/1982 | Yoshida | 219/121 ED |
| 4,347,552 | 8/1982 | Pearcy et al. | 361/398 |
| 4,644,643 | 2/1987 | Sudo | 29/845 |
| 4,877,176 | 10/1989 | Kubis | 228/173.5 |
| 5,083,928 | 1/1992 | Aikens et al. | 439/82 |
| 5,147,227 | 9/1992 | Yurko | 439/773 |

FOREIGN PATENT DOCUMENTS 54-99971 8/1979 Japan.
1-90591 4/1989 Japan.

*Primary Examiner*—Laura Thomas
*Attorney, Agent, or Firm*—Burns, Doane, Swecker & Mathis, L.L.P.

[57] ABSTRACT

A circuit board has holes extending therethrough, and a solder layer disposed on a first side of the board. Terminals have been pushed through respective holes and into contact with the solder layer. The terminals have been welded to the first side of the circuit board in a fluxless manner by an irradiated energy beam.

7 Claims, 19 Drawing Sheets

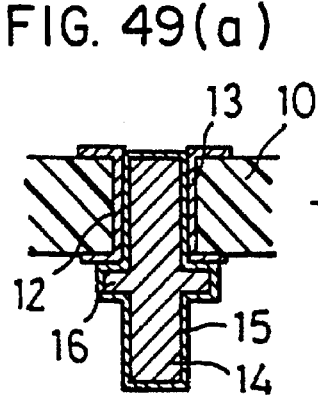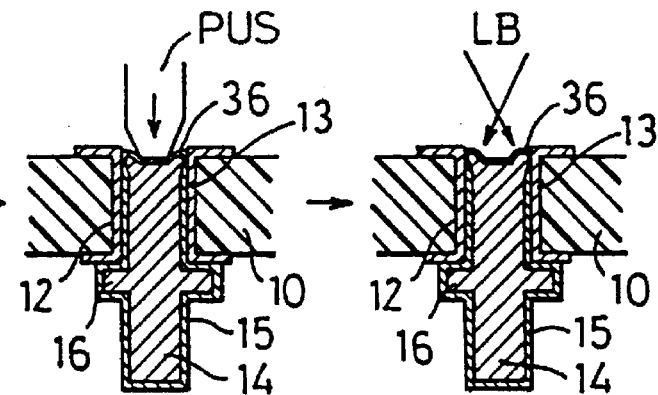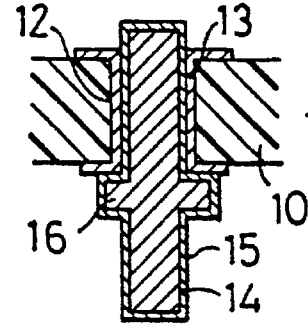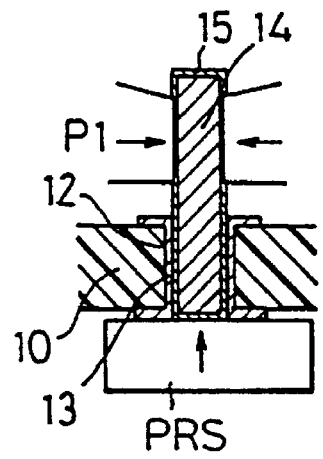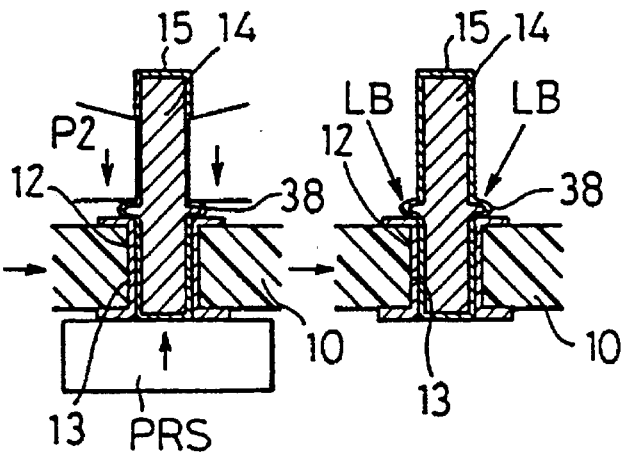

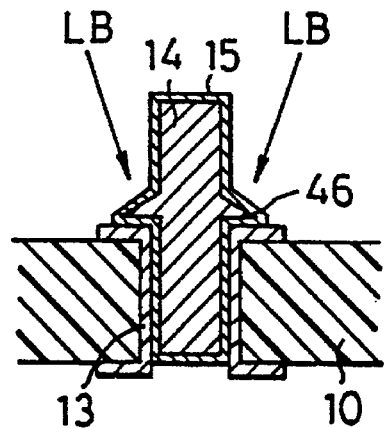
FIG. 64
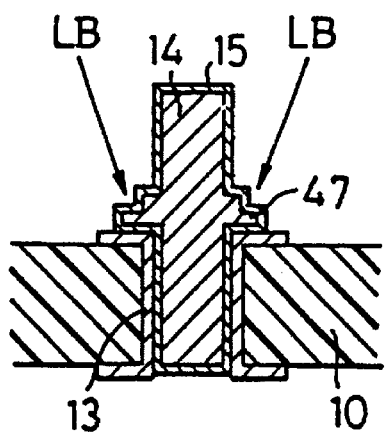
FIG. 65
FIG. 66(a)   FIG. 66(b)   FIG. 66(c)
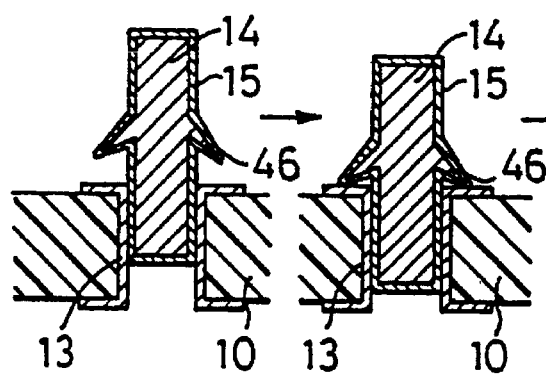
FIG. 67
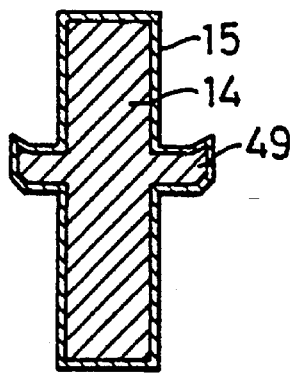
FIG. 68
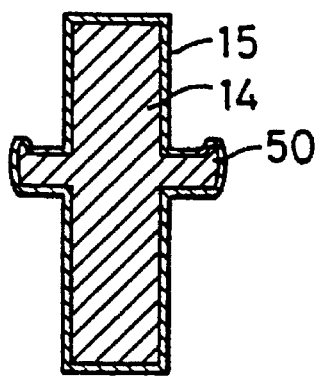
FIG. 69
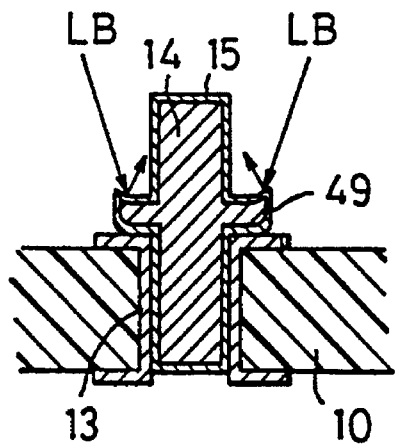

FIG. 70  FIG. 71  FIG. 72  FIG. 73
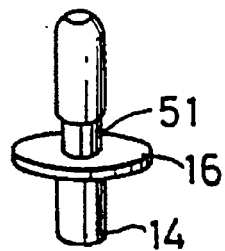
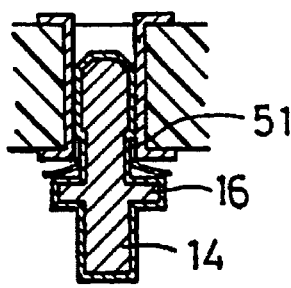
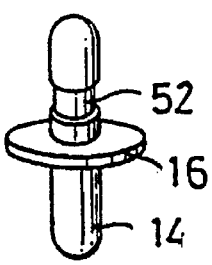
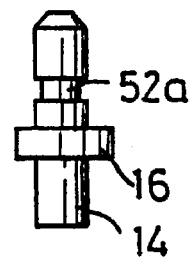
FIG. 76  FIG. 77
FIG.74(b)  FIG.75(b)
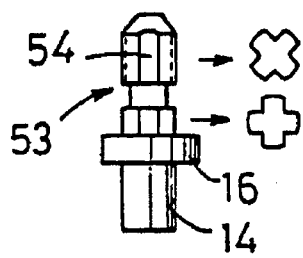
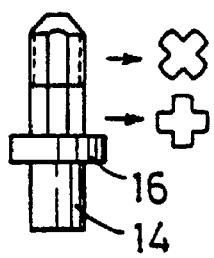
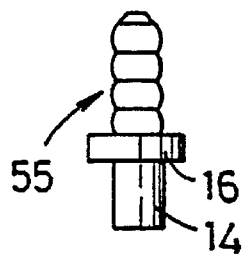
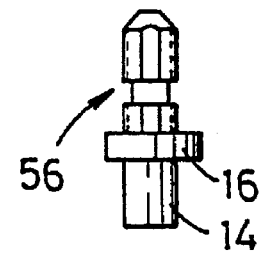
FIG.74(a)  FIG.75(a)
FIG. 78  FIG. 79(a)  FIG. 80
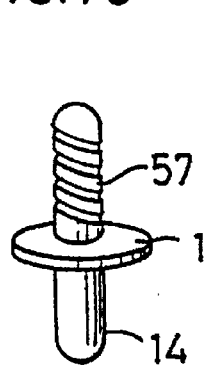
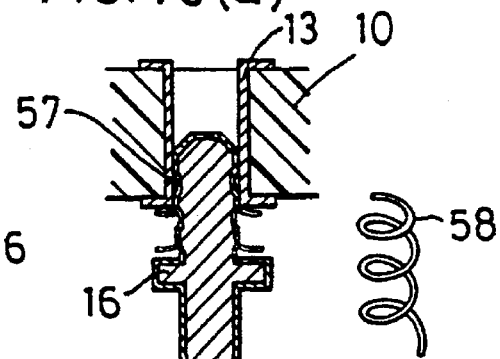
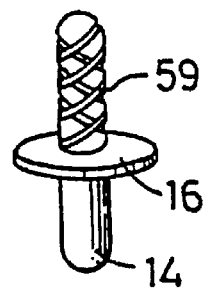
FIG. 79(b)
FIG. 81  FIG. 82
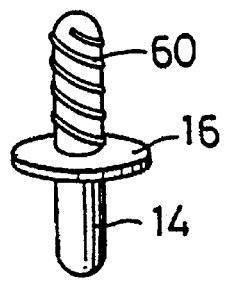
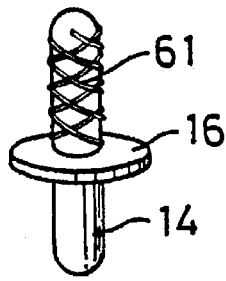

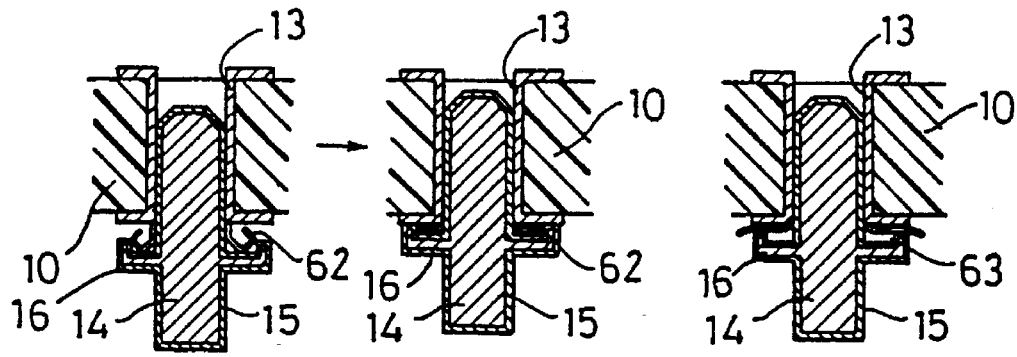
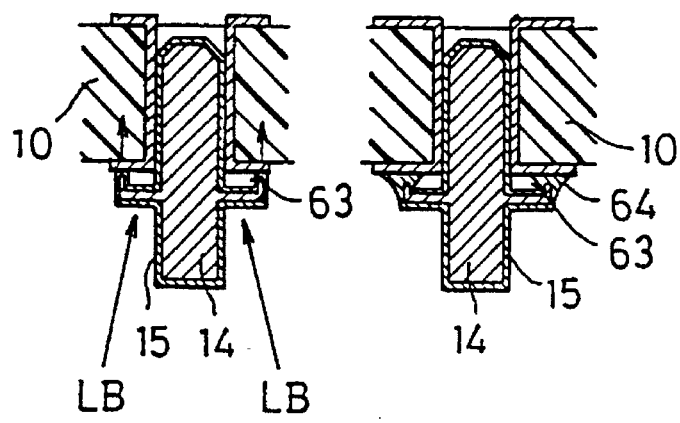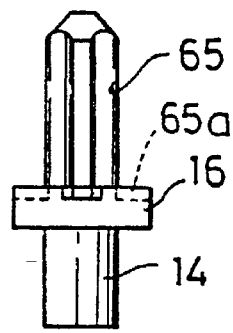
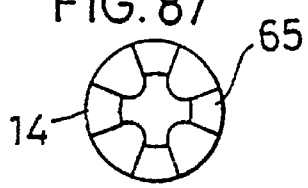
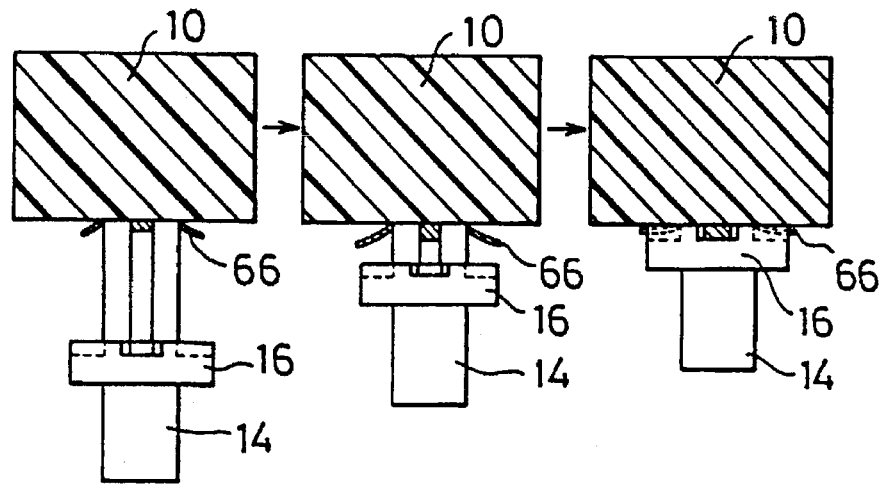

TERMINAL-CARRYING CIRCUIT BOARD

This application is a divisional of application Ser. No. 08/120,429, filed Sep. 14, 1993 U.S. Pat. No. 5,497,546.

BACKGROUND OF THE INVENTION

This invention relates generally to a method for mounting lead terminals to circuit board, and to a terminal-carrying circuit board manufactured by such method.

DESCRIPTION OF RELATED ART

In joining the lead terminals to the circuit board, in general, solder-plated terminals have been thrust respectively into each through hole made in the circuit board, and soldered to printed circuit or the like conducting member on the board by means of a jet-type or dipping-type soldering device. In this event, it has been required to use a large amount of soldering flux as applied to soldering surface of the circuit board by painting the flux onto the surface or dipping the surface into the flux, so as to achieve an excellent soldering. The use of the solder-plated lead terminals has also involved a problem that the solder layer provided on the terminals is caused to be rather reduced in thickness when dipped in molten solder so as to be reduced, for example, from 5–10 μm thick to 1–2 μm thick. Further, when the circuit board is made larger, there has arisen another problem that the soldering is apt to become inferior at positions of the lead terminals.

As a measure for eliminating such problems, there has been suggested in Japanese Patent Laid-Open Publication No. 54-99971 of Nakanishi et al a method allowing the soldering to be completed with a smaller amount of the flux, by preliminarily plating with the solder the lead terminals and conductor parts adjacent to the through holes of the circuit board to which the terminals are to be joined, inserting the plated lead terminals into the through holes, and irradiating a heat ray beam with respect to the joining parts. In U.S. Pat. No. 4,877,176 to L. S. Kubis, further, there has been disclosed another measure in which a solder layer is provided in the through holes of the circuit board so that the lead terminals can be thrust into the holes penetrating through the solder layer, and the terminals can be joined to the circuit or the like with an effectively reduced amount of the soldering flux.

However, while these known measures for mounting the lead terminals to the circuit board have been able to reduce the required amount of flux, they still require the soldering work to be performed with flux employed for soldering the terminals to the circuit or conductor members on the circuit board, and there have still remained problems in the required cumbersome treatment, administration of the soldering flux before the work and washing-out of the flux after the work. In the soldering work employing the flux, further, there has been still another problem that the solder layer interposed between the lead terminal and the through hole is subjected to a fluctuation in the thickness due to fluctuation in heating extent, and the joining of the lead terminals with the circuit board has reduced reliability.

SUMMARY OF THE INVENTION

A main object of the present invention is, therefore, to provide a method which is capable of performing the mounting of the lead terminals to the circuit board without using any soldering flux, while restraining any fluctuation in the thickness of the solder layer interposed between the lead terminals and the circuit board, and remarkably improving eventually the reliability of the connection of the lead terminals to the circuit or the like conductor members of the circuit board.

According to the present invention, the above object can be realized by means of a method for mounting the lead terminals to the circuit board, in which the lead terminals are plated with a layer of solder, the solder-plated lead terminals are thrust respectively into each through hole of the circuit board and having a conductive inner wall surface of a layer of solder, and an energy beam is irradiated with respect to the lead terminals to weld the lead terminals to the inner wall surface of the through holes in a fluxless manner.

According to the above method of the present invention, as will be readily appreciated, the thrusting of the lead terminals carrying the plated solder layer into the through holes of the circuit board respectively having the conductive inner wall surface causes fresh surfaces to be formed on both of the solder layers of the lead terminals and of the inner wall surface of the through holes, which fresh surfaces intimately engage with each other to remarkably improve the tight engagement between them, and, further, the irradiation of the energy beam with respect to the lead terminals thus tightly engaged to the inner wall surface of the through holes enables the lead terminals to be extremely excellently joined with the inner wall surface of the through holes.

Other objects and advantages of the present invention shall be made clear in following description of the invention detailed with reference to preferred embodiments of the invention as will be shown in accompanying drawings.

BRIEF DESCRIPTION OF THE DRAWINGS

FIGS. 49 to 51 are explanatory views for the mounting of the lead terminal in respective other embodiments according to the present invention;

FIGS. 64 and 65 are explanatory views for the mounting of the lead terminal in two further embodiments according to the present invention;

FIG. 66(a) to 66(c) are explanatory views for sequential steps of the mounting of the lead terminal shown in FIG. 64;

FIGS. 67 and 68 show in vertical sectioned views of the lead terminal in respective two further embodiments according to the present invention;

FIG. 69 is an explanatory view for the mounting of the lead terminal in the embodiment of FIG. 67;

FIG. 70 is a perspective view of the lead terminal in another embodiment of the present invention;

FIG. 71 is an explanatory view for the mounting of the lead terminal of FIG. 70;

FIG. 72 is a perspective view of the lead terminal in another embodiment of the present invention;

FIGS. 73 to 77 are side elevations of the lead terminal in further different embodiments according to the present invention;

FIG. 78 is a perspective view of the lead terminal in still another embodiment according to the present invention;

FIG. 79 is an explanatory view for the mounting of the lead terminal of FIG. 78;

FIGS. 80 to 82 show in perspective views the lead terminal in still further embodiments according to the present invention;

FIGS. 83 to 85 are explanatory views for the mounting of the lead terminal in further different embodiments according to the present invention;

FIG. 86 is a side elevation of the lead terminal in another embodiment according to the present invention;

FIG. 87 is a top plan view of the lead terminal in FIG. 86;

FIG. 88 is an explanatory view in sequential steps for the mounting of the lead terminal of FIG. 86;

It should be appreciated here that, while the present invention shall be described with reference to the respective embodiments shown in accompanying drawings, the intention is not to limit the invention only to these embodiments shown but rather to include all alterations, modifications and equivalent arrangements possible within the scope of appended claims.

DETAILED DESCRIPTION OF THE PREFERRED EMBODIMENTS

Figure 1:
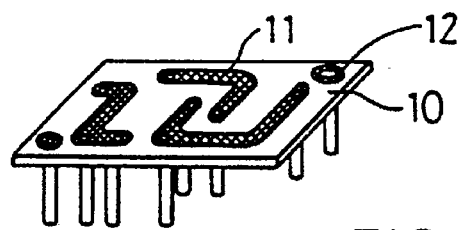
FIG. 1 is a perspective view a circuit board with the lead terminals mounted thereto in an embodiment according to the present invention.
Figure 2:
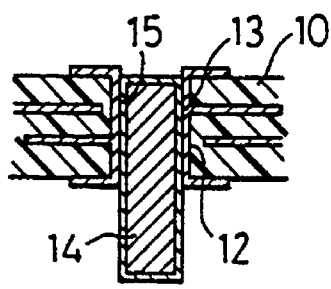
FIG. 2 is a magnified fragmentary sectioned view of the circuit board in FIG. 1.
Figure 3:
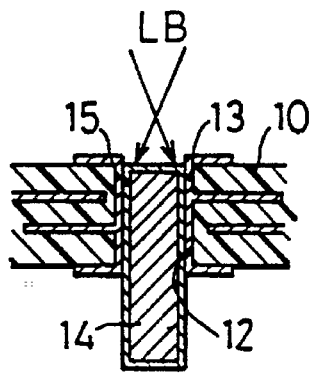
FIG. 3 is a view similar to FIG. 2 for explaining the mounting of the lead terminal to the circuit board of FIG. 1.

Referring to FIGS. 1–3, there is shown an embodiment of the present invention, in which a circuit board 10 has at least a circuit pattern 11 printed in a predetermined pattern, through holes 12 are made in the circuit board 10 to penetrate through the circuit pattern 11 at selected positions, and a conductive inner wall surface 13 is formed by a pre-installation lining of solder within each of the through holes 12 for receiving a lead terminal 14. In the present instance, a pre-installation solder layer 15 is formed on the outer peripheral surface of each lead terminal 14. In this case, the solder layer 13 of the through hole 12 will extend over both surfaces of the circuit board 10.

In the present embodiment, the lead terminal 14 covered by the solder layer 15 is thrust into the through hole 12, and such energy beam LB as a laser beam is irradiated with respect to contacting portions of the solder layer 15 on the lead terminal 14 with the conductive inner wall 13 formed by the solder layer, whereby the lead terminal 14 can be reliably welded in fluxless manner to the conductive inner wall surface of the through hole 12.

In the above arrangement, such materials as follows may be employed for respective constituents:

| | |
|---|---|
| a) Insulating base of the circuit board 10: | Epoxy resin reinforced by glass fibers, alumina |
| b) Circuit pattern 11: (forming part of inner wall of through hole) | Au, Ag, Cu |
| c) Conductive inner wall surface 13: | Sn—Pb—Sn, Sn alloys |
| d) Lead terminal 14: | FeNi, Kovar (Fe—Ni—Co alloy), Cu alloys |
| e) Solder layer 15 on the lead terminal: | Sn—Pb, Sn, Au—Sn, Cu, Si |

In the above arrangement, further, the solder layer 15 is formed preferably by means of a plating, which including all possible measures for providing the solder layer, such as deposition or vacuum metallizing, sputtering, coating through dipping or the like, and so on. The circuit board 10 should include such single layer board having the circuit pattern on one or both surfaces as shown in FIG. 1, and such multi-layer board having interlayer circuit patterns as shown in FIGS. 2 and 3. While in some drawings in the following the circuit board 10 is shown as a single layer board, it is replaceable with a multi-layer board, if desired. In such multi-layer board, the through holes 12 may be a part of the circuit pattern and are provided to connect at their respective inner peripheries one or ones of the interlayer circuit patterns, then the lead terminal 14 may be electrically connected through the solder layer 15 and conductive inner wall surface 13 with the interlayer circuit patterns.

According to the foregoing mounting method of the lead terminal to the circuit board 10 with reference to FIGS. 1–3, the thrusting of the lead terminal 14 into the through hole 12 causes the solder layer 15 and inner wall surface 13 to scratch each other, so that the lead terminal 14 can tightly intimately contact with the inner wall surface 13 of the through hole 12 through fresh surfaces exposed on both of the solder layer 15 and inner wall surface 13 as a result of the scratch.

Figure 4:
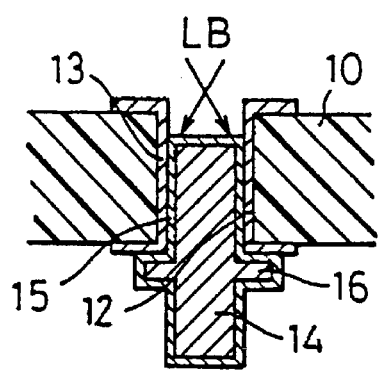
FIGS. 4 and 5 are fragmentary sectioned views of the circuit board in other embodiments of the present invention.
Figure 5:
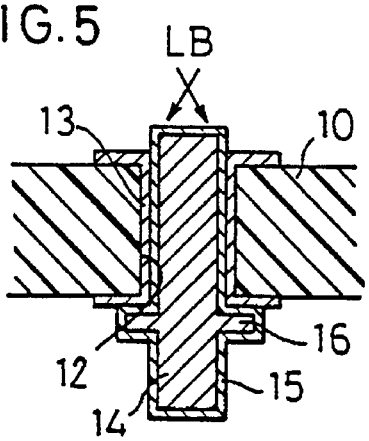

In another embodiment shown in FIG. 4, the lead terminal 14 is provided with a peripheral flange 16 which has a stop surface facing a terminal outlet end of a respective through hole, the terminal outlet end being situated opposite a terminal inlet end of the through hole into which the terminal is inserted. The stop surface limits an extent of insertion of the terminal when the lead terminal 14 is thrust into the through hole 12, so that thrusting level of the lead terminal 14 with respect to the circuit board 10 can be optimally set. By providing the lead terminal 14, with a flange 16 the thrust side tip end of the lead terminal 14 can be positioned below or inside the top surface of the circuit board 10. As shown in FIG. 5, further, it is possible to employ an arrangement in which the thrust side tip end of the lead terminal 14 is positioned to project out of the through hole and the top surface of the circuit board 10, and also such arrangement as shown in FIGS. 2 and 3 where the tip end of the lead terminal 14 is so positioned as to be substantially flush with the top surface of the circuit board 10. Other constituents and functions of the embodiments in FIGS. 4 and 5 are the same as those in the embodiment of FIGS. 1–3.

Figure 6A:
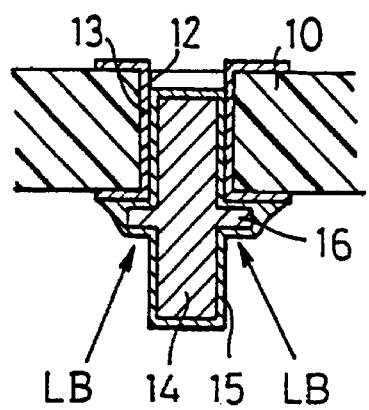
FIG. 6(a) is a magnified fragmentary sectioned view of the circuit board in another embodiment of the present invention.
Figure 6B:
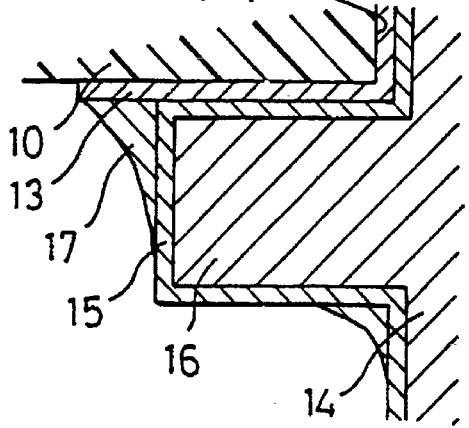
FIG. 6(b) shows a part of the sectioned view of FIG. 6(a) as further magnified.

In another embodiment shown in FIGS. 6(a) and 6(b), the energy beam LB is irradiated with respect to the flange 16, that is, from lower side in the drawing of the circuit board 10, so that a fillet 17 of the solder will be formed at a corner in particular, between opposing bottom surface of the board 10 and peripheral edge of the flange 16. With this fillet 17, the lead terminal 14 can be tightly joined at the flange 16 with the circuit board 10. Other constituents and functions in the embodiment of FIGS. 6(a) and 6(b) are the same as those in the embodiment of FIGS. 1–3.

Figure 7:
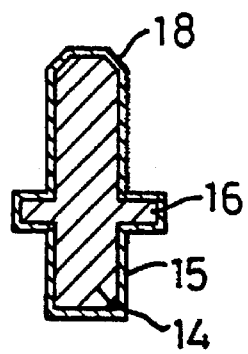
FIGS. 7 and 8 are magnified sectioned views of the lead terminal in other embodiments of the present invention.
Figure 8:
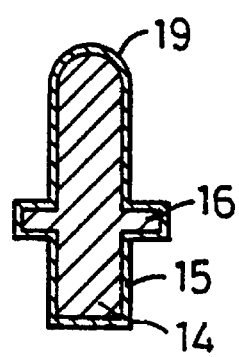
Figure 9:
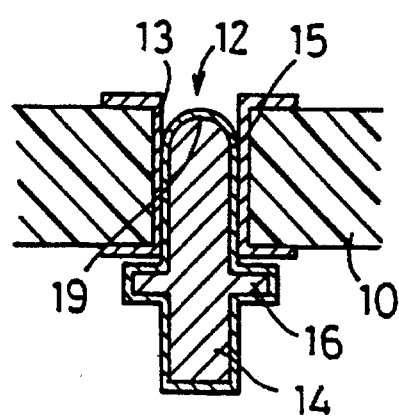
FIGS. 9 and 10 are explanatory views for the mounting to the circuit board of the lead terminal in the embodiment of FIG. 8.
Figure 10:
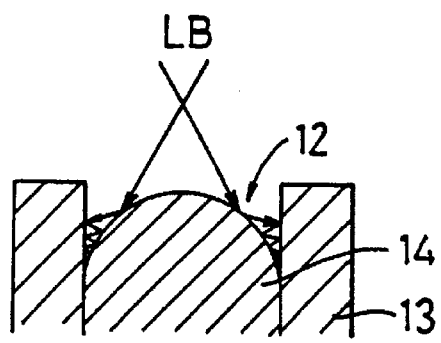
Figure 11:
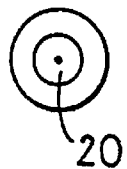
FIGS. 11 to 14 are top plan views of the lead terminals in other embodiments according to the present invention.
Figure 12:
Figure 13:
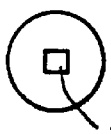
Figure 14:

In another embodiment shown in FIG. 7 of the present invention, the lead terminal 14 is formed to have a tapered part 18 at corner edge of the thrust side tip end. It is also possible to form the tip end as a hemispherical part 19 as shown in FIG. 8. In these cases, the energy beam LB can be efficiently provided to the corner edge part of the lead terminal 14 since, when the terminal is mounted to the circuit board 10 as thrust into the through hole 14 as shown in FIG. 9 and the energy beam LB is irradiated from above towards the edge part as shown in FIG. 10, the irradiated energy beam LB is caused to attain a multipath reflection in a sharp space formed by the tapered part 18 or hemispherical part 19. In this case, the expected results are achievable even when the thrust side tip end of the lead terminal 14 is roughened or stained. Accordingly, it is made possible to reach the expected results without paying much attention for a sufficient administration of the thrust side tip end of the lead terminal. Other constituents and functions in the embodiments of FIGS. 7 and 8 are the same as those in the foregoing embodiment of FIGS. 1–3.

Figure 15:
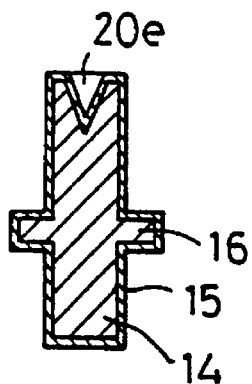
FIGS. 15 and 16 are sectioned views of the lead terminals in the embodiments of FIGS. 11–14.
Figure 16:
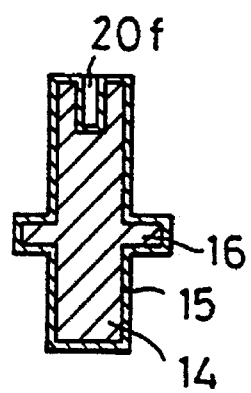
Figure 17:
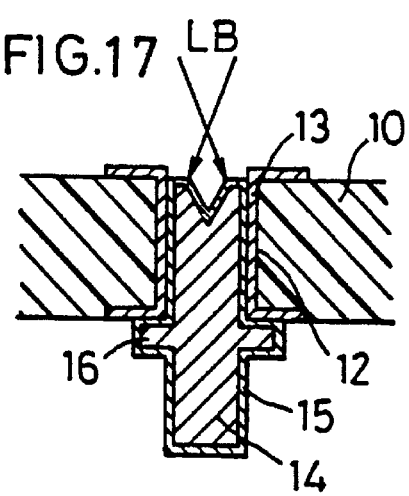
FIG. 17 is an explanatory view for the mounting of the lead terminal in the embodiment of FIG. 11 or 15.

In other embodiments shown in FIGS. 11 to 14 of the present invention, the lead terminal 14 is provided in the thrust side tip end with one of recesses 20a–20d of various shapes which are mutually different in their plan view as seen in FIGS. 11–14 or even in vertically sectioned view as shown in FIGS. 15 and 16. In the case of these embodiments, it is also possible to cause the multipath reflection of the irradiated energy beam LB to occur within the recess at the tip end of the lead terminal 14 as shown in FIG. 17 for the efficient energy provision. In the case when such recess V-shaped in vertical section as shown in FIG. 15 is employed, it is desirable to define opening angle of the V-shaped recess to be less than 30 degrees. Since the efficiency of the energy provision can be increased at the thrust side tip end of the lead terminal 14 by means of the recess, the expected results can be also achieved even without much attention to the administration of the thrust side tip end of the lead terminals. In the embodiments of FIGS. 11 to 16, all other constituents and functions are the same as those in the embodiment of FIGS. 1 to 3.

Figure 18:
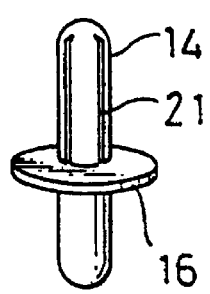
FIG. 18 is a magnified perspective view of the lead terminal in another embodiment according to the present invention.
Figure 19:
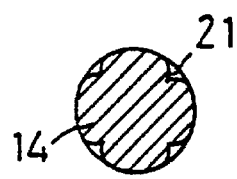
FIG. 19 is a magnified cross-sectioned view of the lead terminal in the embodiment of FIG. 18.
Figure 20:
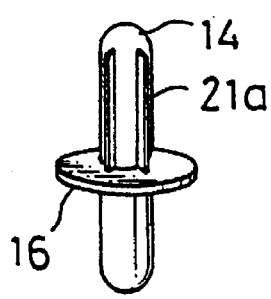
FIG. 20 is a magnified perspective view of the lead terminal in another embodiment according to the present invention.
Figure 21:
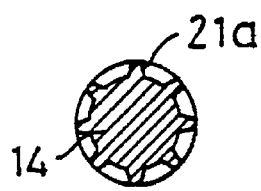
FIG. 21 is a magnified cross-sectioned view of the lead terminal of FIG. 20.
Figure 22:
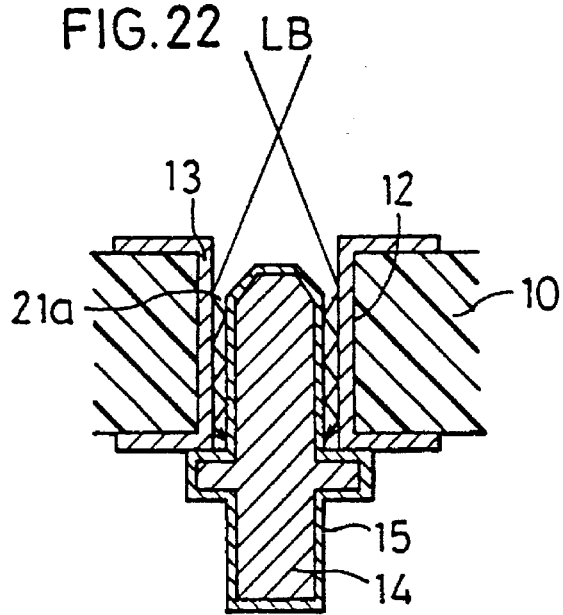
FIG. 22 is an explanatory view for the mounting of the lead terminal in the embodiment of FIG. 20.
Figure 23:
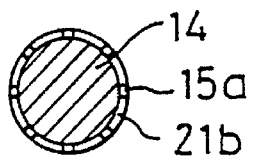
FIG. 23 is a magnified cross-sectioned view of the lead terminal in still another embodiment of the present invention.

In another embodiment of the present invention as shown in FIGS. 18 and 19, the lead terminal 14 is provided on thrust side periphery with longitudinal grooves 21 mutually separated in circumferential direction. In another embodiment shown in FIGS. 20 and 21 of the present invention, on the other hand, the longitudinal recesses 21a are provided by means of circumferentially separated radial ribs on the thrust side periphery of the lead terminal 14. When the lead terminal 14 of the type shown in FIG. 20, for example, is mounted to the circuit board 10 and the energy beam LB is irradiated thereto as shown in FIG. 22, the multipath reflection of the energy beam is caused to occur within the respective longitudinal recesses 21a, whereby the energy beam LB can be highly efficiently provided to the lead terminal 14, and any thermal stress occurring in the multi-layered circuit board itself and between the circuit board and the lead terminal can be relieved. The lead terminal 14 of the type shown in FIGS. 18 and 19 is also effective to achieve the same function as in the above. Further, it is also possible to attain the same function by means of partial plating of rib-like solder layer portions 15a circumferentially separated on the thrust side periphery of the lead terminal 14 as shown in FIG. 23. In these embodiments of FIGS. 18 to 21 and 23, all other constituents and functions are the same as those in the embodiment of FIGS. 1 to 3.

Figure 24:
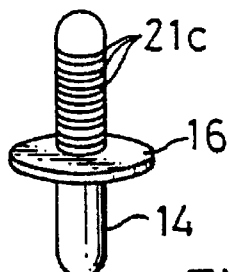
FIGS. 24 and 25 are perspective views of the lead terminal in further embodiments of the present invention.
Figure 25:
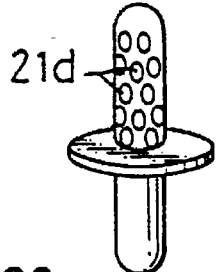
Figure 26:
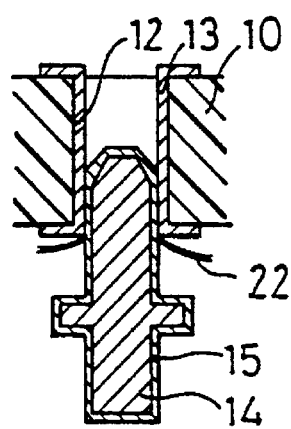
FIGS. 26 and 27 are explanatory views for the mounting in an intermediate stage of the lead terminal in the embodiments of FIGS. 24 and 25.
Figure 27:
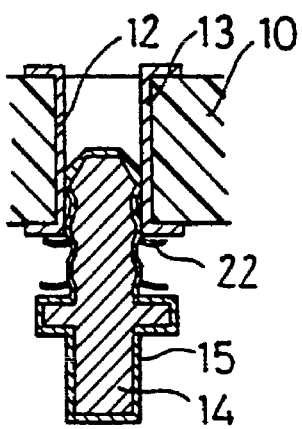
Figure 28:
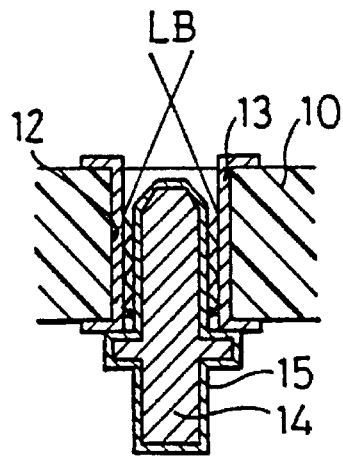
FIG. 28 is an explanatory view for the mounting in a final stage of the lead terminal in the embodiments of FIGS. 24 and 25.

In another embodiment shown in FIG. 24, annular ribs 21c are formed on the thrust side periphery of the lead terminal 14 as mutually separated in axial direction of the terminal. In another embodiment shown in FIG. 25, short ribs or projections 21d are provided in spots on the thrust side periphery of the lead terminal 14. These annular ribs 21c and projections 21d may be formed also by means of the partial plating of the solder layer. These embodiments of FIGS. 24 and 25 are effective to prevent any risk of short-circuit or the like apt to occur due to any fins of the solder yielded upon thrusting scratch of the terminal into the through hole. That is, when the lead terminal 14 having the entirely plated solder layer 15 is thrust into the through hole 12 of the circuit board 10 as shown in FIG. 26, there are yielded some elongated fins 22 from the solder layer 15 scratched by the inner wall surface 13 of the through hole 12, which fins 22 are unable to be easily removed in complete manner by means of generally employed air blow gun so that the fins 22 thus remained but falling after installation of the circuit board 10 onto any electric device or equipment may be a cause of the short-circuit or the like risk. In the event where the annular ribs 21c or spotted short ribs or projections 21d are provided on the lead terminal 14, only short fins 22 are yielded as shown in FIG. 27 so that the short fins 22 can be held in the recesses between the respective ribs 21c or 21d or between opposing surfaces of the circuit board 10 and the flange 16 of the terminal 14, and any affection of the fins 22 after the installation of the circuit board 10 can be eliminated. Further, in the case of the embodiments of FIGS. 24 and 25 of the lead terminal 14, the energy beam LB can be provided at a high efficiency by the multipath reflection of the energy beam LB caused between adjacent ones of the annular ribs 21c or of the spotted short ribs or projections 21d when the energy beam LB is irradiated to the lead terminal 14 mounted to the circuit board 10 as shown in FIG. 28. In these embodiments of FIGS. 24 and 25, too, all other constituents and functions are the same as those in the foregoing embodiment of FIGS. 1 to 3.

Figure 29:
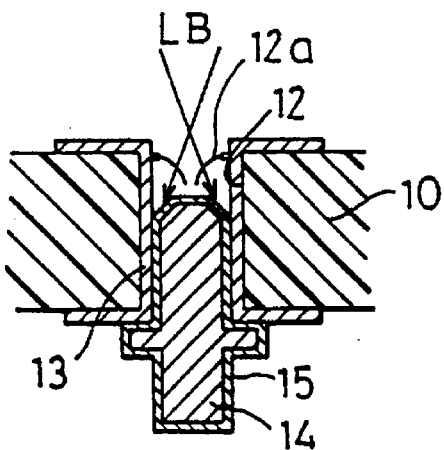
FIGS. 29 and 30 are explanatory views for the mounting of the lead terminal in other embodiments according to the present invention.
Figure 30:
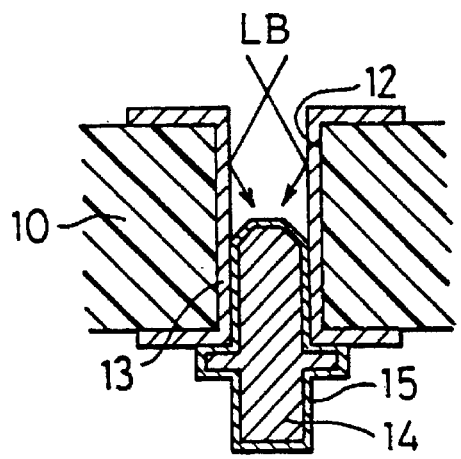

In another embodiment shown in FIG. 29 of the present invention, the lead terminal 14 which is made short in axial size is employed. While in this case the thrust side tip end of the lead terminal 14 terminates at a position retracted inside the through hole 12 so that there may arise a risk that a relatively large extent of the multipath reflection of the irradiated energy beam LB within the remaining through hole 12 as shown in FIG. 30 may cause sputtering, vacuum metallizing or the like to scatter out of the remaining through hole, the present embodiment employs a scatter preventing means 12a extending radially inward from the inner wall surface 13 at its portion close to the top surface in the drawing of the circuit board 10, and the scattering can be thereby restrained. Other constituents and functions of this embodiment are the same as those in that of FIGS. 1 to 3.

Figure 31:
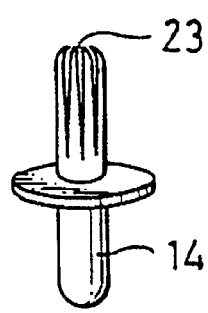
FIG. 31 is a perspective view of the lead terminal in still another embodiment according to the present invention.
Figure 32:
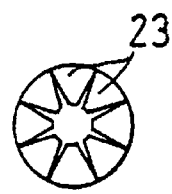
FIG. 32 is a top plan view of the lead terminal of FIG. 31.
Figure 33:
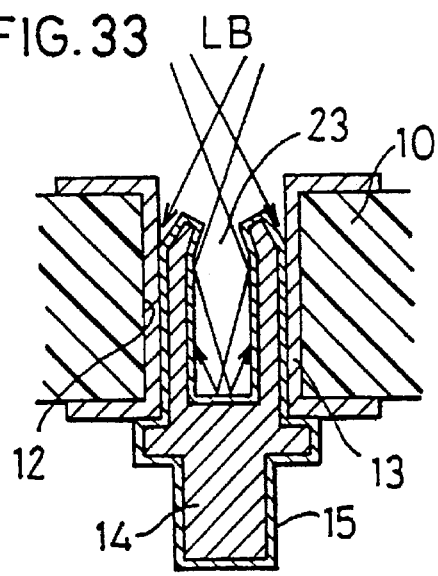
FIG. 33 is an explanatory view for the mounting of the lead terminal in the embodiment of FIG. 31.

In another embodiment shown in FIGS. 31 and 32, the lead terminal 14 is formed on its thrust side part to be divided into a plurality of longitudinal members 23 respectively tapered and slightly bent inward at their tip end portions with axial portion of the thrust side part removed to be hollow so that, when this lead terminal 14 is mounted to the circuit board 10 and the energy beam LB is irradiated as shown in FIG. 33, the beam will be led into sharp space between the inward bent tip portions of the longitudinal divided members 23 and the inner wall surface 13 of the through hole 12, small gaps between the members 23 and the hollow axial portion of the terminal 14, so as to cause the multipath reflection to occur in and around the thrust side part of the lead terminal 14 for providing thereto a sufficient energy to the joining parts between the inner wall surface 13 of the through hole 12 and the lead terminal 14.

Figure 34:
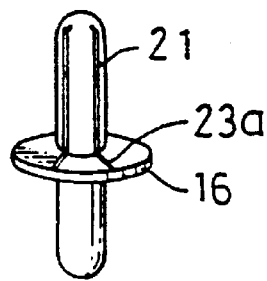
FIG. 34 is a perspective view of the lead terminal in another embodiment of the present invention.
Figure 35:
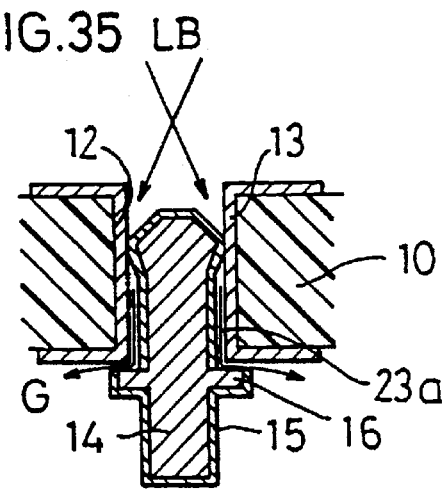
FIG. 35 is an explanatory view for the mounting of the lead terminal in the embodiment of FIG. 34.

In another embodiment shown in FIG. 34, the lead terminal 14 is provided in the thrust side part with a plurality of longitudinal grooves 21 and in the flange 16 with a plurality of radial grooves 23a respectively continuous to each of the longitudinal grooves 21. That is, though there is a risk that the thrust side tip end part of the lead terminal 14 mounted in the through hole 12 of the circuit board 10 and subjected to the energy beam LB irradiated is melted to completely close small gap between the terminal 14 and the inner wall surface 13 of the through hole 12 with molten metal from the terminal so that such gas as air, vacuum metallizing or the like held between the terminal 14 and the inner wall surface 13 may cause the closing metal to be blown off to be scattered due to thermal expansion, the present embodiment is effective, as shown in FIG. 35, to allow the inside remained gas as thermally expanded to be discharged through the longitudinal grooves 21 and continuous radial grooves 23a. All other constituents and functions of this embodiment of FIG. 34 are the same as those in the embodiment of FIGS. 1 to 3.

Figure 36:
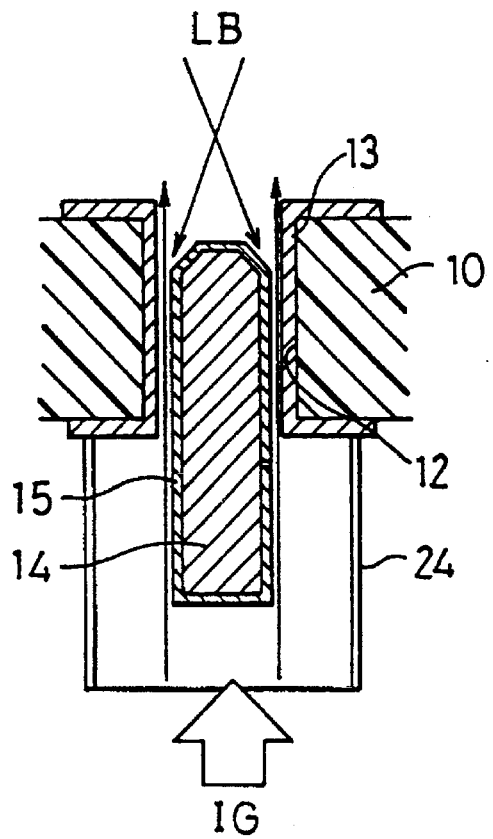
FIGS. 36 and 37 are explanatory views for the mounting of the lead terminal in other embodiments according to the present invention.
Figure 37:
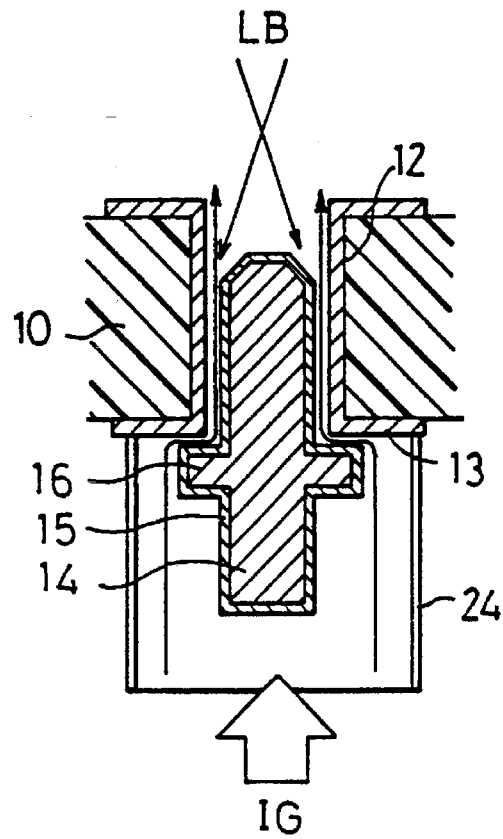

In another embodiment shown in FIGS. 36 of the present invention, while such energy beam LB as the laser is irradiated with respect to the thrust side tip end of the lead terminal 14 shown to be of the type having no flange, such inert gas IG as $N_2$, Ar, He or the like is supplied to the periphery of the other side end part of the terminal through a cylindrical guide 24 enclosing the other end side, so as to prevent any oxidation apt to occur upon the joining between the inner wall surface 13 of the through hole 12 and the thrust side part of the lead terminal 14. In the case of the lead terminal 14 of the type having the flange 16, as shown in FIG. 37, it is also possible to effectively prevent the oxidation with the supply of the inert gas, and the joining can be stabilized. Other constituents and functions of the embodiments shown in FIGS. 36 and 37 are the same as those in the embodiment of FIGS. 1 to 3.

Figure 38:
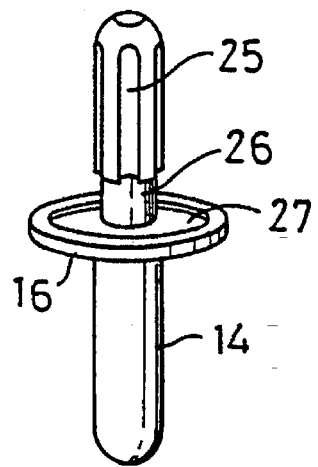
FIG. 38 shows in a perspective view the lead terminal in another embodiment according to the present invention.
Figure 39:
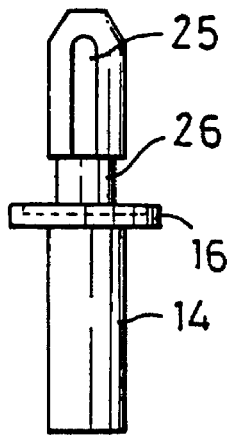
FIG. 39 is a side elevation of the lead terminal in the embodiment of FIG. 38.
Figure 40:
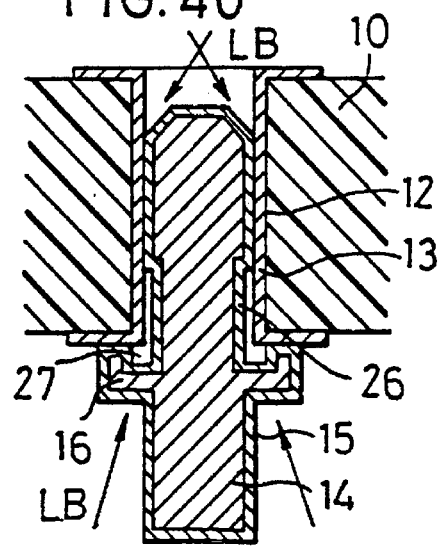
FIG. 40 is an explanatory view for the mounting of the lead terminal in the embodiment of FIG. 38.

In another embodiment shown in FIGS. 38 and 39, the lead terminal 14 is provided in the periphery of the thrust side end part with a plurality of longitudinal grooves 25 mutually separated circumferentially, in middle part also on the thrust side with respect to the flange 16 with a smaller diametered part 26, and in the thrust side surface of the flange 16 with an annular recess 27. When this lead terminal 14 is mounted to the circuit board 10 as thrust into the through hole 12 and the energy beam LB is irradiated from both sides of the thrust side tip end and the flange 16, as shown in FIG. 40, there occurs the multipath reflection of the energy beam within these grooves 25, small diametered part 26 and annular recess 27 to provide to the joining parts between the circuit board 10 and the lead terminal 14 at a higher efficiency, while these positive gap means 25–27 is effective to reduce the yield of fins of the solder upon the thrusting work. Further, the annular recess 27 is effective to accommodate the solder fins so that the fins will be held under a pressure between the flange 16 and opposing surface of the circuit board 10 so as to increase the tight engagement between the inner wall surface 13 and the lead terminal 14, and the heat provided upon the irradiation of the energy beam LB to the flange 16 can be highly concentrated onto the flange. Other constituents and functions of the embodiment of FIGS. 38 and 39 are the same as those in the foregoing embodiment of FIGS. 1–3.

Figure 41A:
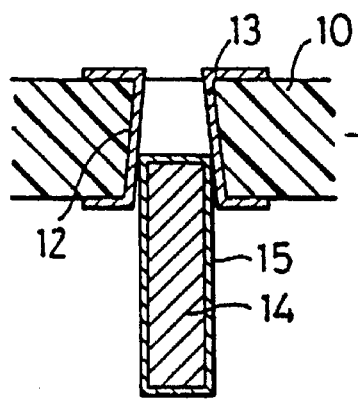
FIGS. 41, 42 and 43 are explanatory views for the mounting of the lead terminal in respective other embodiments according to the present invention.
Figure 41B:
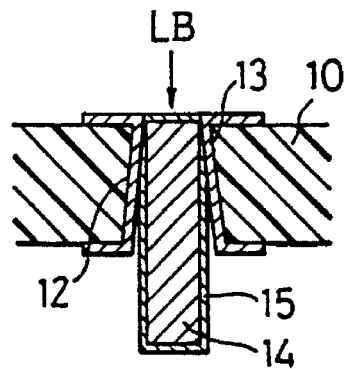
Figure 42A:
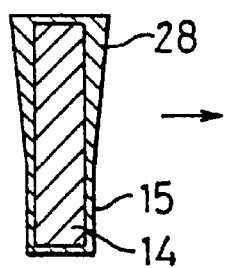
Figure 42B:
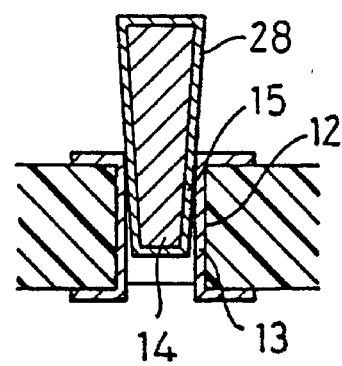
Figure 42C:
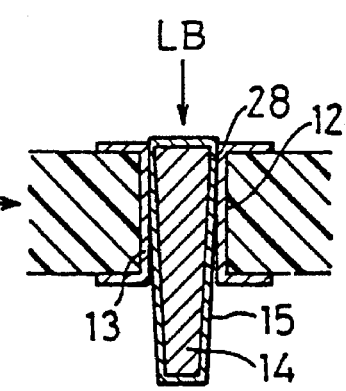
Figure 43A:
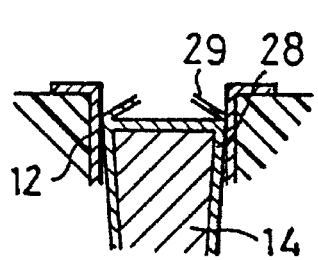
Figure 43B:
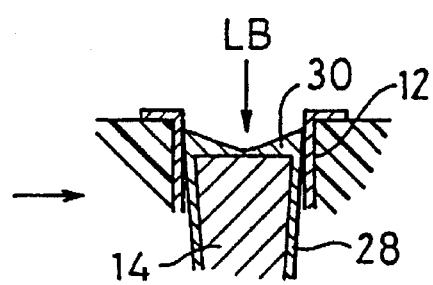

In another embodiment shown in FIGS. 41(a) and 41(b), the through hole 12 as well as its inner wall surface 13 are formed to be tapered through the thickness of the circuit board 10 in the thrusting direction of the lead terminal, from bottom side to upper side in the drawing, and, when the lead terminal 14 is thrust into the through hole 12 of the board 10 as shown in FIG. 41(b), the irradiation of the energy beam LB from the upper side in the drawing opposite to the thrusting direction of the terminal 14 causes the energy to be made applicable to a portion where the lead terminal 14 and through hole 12 are the most intimately engaged with each other, and their joining extent can be further improved. In another embodiment shown in FIGS. 42(a) to 42(c), the lead terminal 14 is tapered in the opposite direction to the above, so as to have a tapered surface 28 increasing its diameter in the direction towards the upper side in the drawings, while the through hole 12 of the circuit board 10 is made straight, so that, when this lead terminal 14 is thrust into the through hole 12 from the increased-diameter end as in FIG. 42(b) and finally as in FIG. 42(c) where the energy beam LB is irradiated, the same results as in the embodiment of FIGS. 41(a) and 41(b) can be attained. Further, as shown in FIGS. 43(a) and 43(b), any solder fins 29 yielded upon the thrusting of the lead terminal 14 in the embodiment of FIG. 42 can be melted by the energy beam LB irradiated to form an additional weld 30 between the lead terminal 14 and the through hole 12. Other constituents and functions of the embodiments shown in FIGS. 41 and 42 are the same as those in the foregoing embodiment shown in FIGS. 1 to 3.

Figure 44:
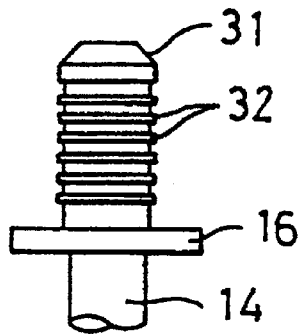
FIG. 44 to 47 show respectively in side elevation with part omitted the lead terminal in further embodiments according to the present invention.
Figure 45:
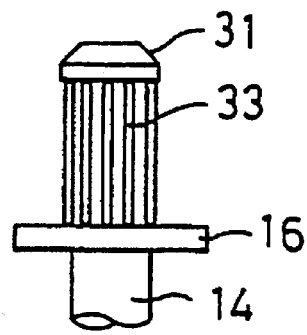
Figure 46:
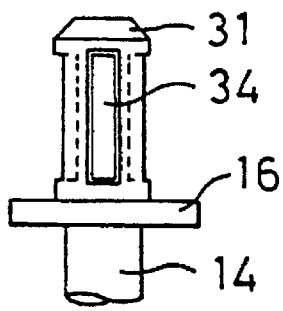
Figure 47:
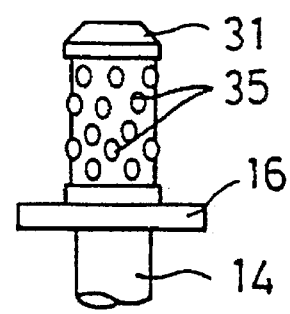
Figure 48A:
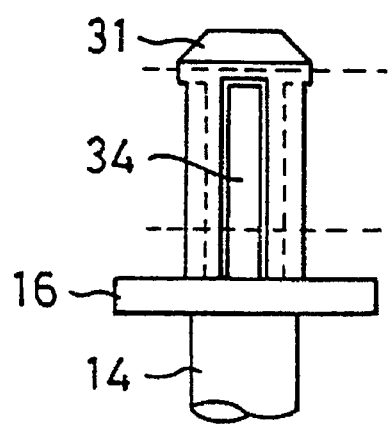
FIG. 48(a) is an enlarged side elevation with part omitted of the lead terminal in still another embodiment of the present invention.
Figure 48B:
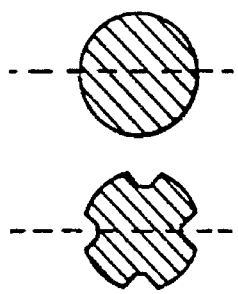
FIG. 48(b) is a cross-sectional of the shapes at different parts of the lead terminal in FIG. 48(a)

In another embodiment shown in FIG. 44 of the present invention, the lead terminal 14 is formed to have a tip end 31 of circular truncated cone shape and a plurality of annular ribs 32 provided between the tip end 31 and the flange 16 as mutually separated in axial direction of the terminal 14. In still another embodiment in FIG. 45, the lead terminal 14 is provided between the tip end 31 and the flange 16 with a plurality of axially extending ribs 33 mutually separated in circumferential direction. In further embodiment of FIG. 46, the lead terminal 14 is varied in the diameter in the intermediate portion between the tip end 31 and the flange 16 from other portion and provided in this portion at least one axially extending recess 34. In another embodiment shown in FIG. 47, the intermediate portion between the tip end 31 and the flange 16 is also varied in the diameter from other portion and is provided with a plurality of spotted projections 35. In another embodiment shown in FIG. 48(a) similar to the above embodiment of FIG. 46, as will be appreciated, the tip end 31 is not provided with any discharge part whereas a discharge part is provided between the tip end 31 and the flange 16. Whereas in these embodiments of FIGS. 44 to 48, in particular, the thrusting of the lead terminal into the through hole 12 of the circuit board can be made easier, it is also made possible to maintain the drawing strength to be high. Other constituents and functions of these embodiments are the same as those in the foregoing embodiment of FIGS. 1 to 3.

In another embodiment shown in FIGS. 49(a) to 49(c), the lead terminal 14 mounted to the circuit board 10 to be substantially flush at the thrust side tip end with the upper side surface of the circuit board 10 as shown in FIG. 49(a) is subjected to a punching at the tip end by means of a punch PUS or the like so that a pressure contacting part 36 is formed at peripheral edge of the tip end of the terminal with respect to the conductive inner wall surface 13 of the through hole 12, as seen in FIG. 49(b), and the energy beam LB is irradiated to the thus punched tip end face of the lead terminal 14, as seen in FIG. 49(c), whereby the inner wall surface 13 of the through hole 12 and the solder layer 15 on the lead terminal 14 can be more tightly intimately joined. In another embodiment of FIGS. 50(a) to 50(c), the lead terminal 14 is so mounted to the circuit board 10 as to project the tip end out of the through hole 12 as seen in FIG. 50(a), this projected tip end of the lead terminal 14 is deformed by a pressure machine PRS into a crushed part 37 as in FIG. 50(b), and the energy beam LB is irradiated with respect to the crushed part 37 as in FIG. 50(c), whereby the inner wall surface 13 of the through hole 12 and the solder layer 15 of the lead terminal 14 are tightly intimately welded. In still another embodiment of FIGS. 51(a) to 51(c), the lead terminal 14 of the type having no flange is employed, the thrust side tip end of the terminal 14 in the mounted state to be flush with one surface of the circuit board 10 is held in position by the pressure machine PRS while the other side projected end of the terminal is secured stationary and a lateral convergent pressure P1 is applied to exposed middle portion of the terminal 14, as in FIG. 51(a). Then, a vertical pressure P2 towards the circuit board 10 is added to the convergent pressure P1, with the pressure of the pressure machine PRS unchanged, so as to deform a portion of the middle portion adjacent to the other surface of the circuit board 10 into a crushed part 38 as in FIG. 51(b), and thereafter the energy beam LB is irradiated to the crushed part 38 as in FIG. 51(c) to have the inner wall surface 13 of the through hole 12 and the solder layer 15 of the lead terminal 14 welded tightly intimately. Other constituents and functions of these embodiments of FIGS. 49, 50 and 51 are the same as those in the foregoing embodiment of FIGS. 1 to 3.

Figure 52:
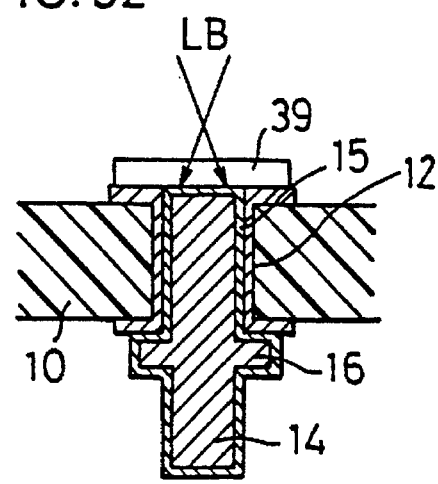
FIGS. 52 to 55 are explanatory views for the mounting of the lead terminal in respective further embodiments according to the present invention.
Figure 53:
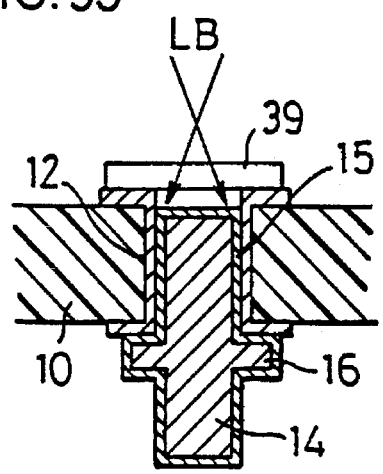

In another embodiment of the present invention as in FIG. 52, the lead terminal 14 is mounted to the circuit board 10 to dispose the thrust side tip end of the terminal substantially flush with one surface of the board 10, and a transparent plate 39 is placed on the through hole 12 and the tip end of the lead terminal 14, so that any sputtering, vacuum metallizing or the like can be prevented from scattering upon irradiation of the energy beam LB through the transparent plate 39. In another embodiment of FIG. 53, the lead terminal 14 is mounted to the circuit board 10 to terminate the thrust side tip end of the terminal at a position retracted from the surface of the board 10, and the transparent plate 39 is placed on the through hole 12 so that the scattering of the sputter, vacuum metallizing or the like upon irradiation of the energy beam LB can be prevented from occurring. With such prevention of the scattering of the sputter, vacuum metallizing or the like, it is enabled to keep the surface of the circuit board 10 clean without being contaminated, and to render the finishing of the board to be excellent. For the transparent plate 39, one made of a glass, transparent alumina or ZnSe can be employed. In these embodiments, other constituents and functions are the same as those in the foregoing embodiment of FIG. 1 to 3.

Figure 54:
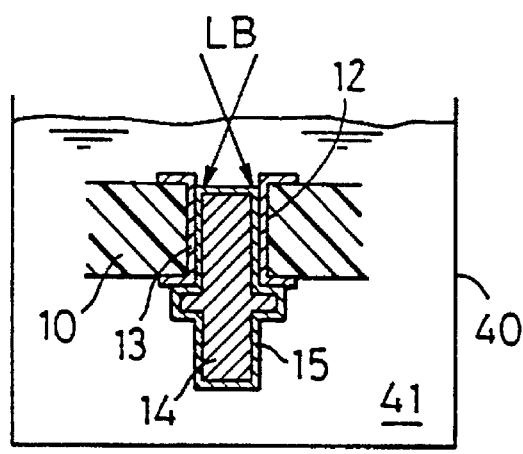
Figure 55:
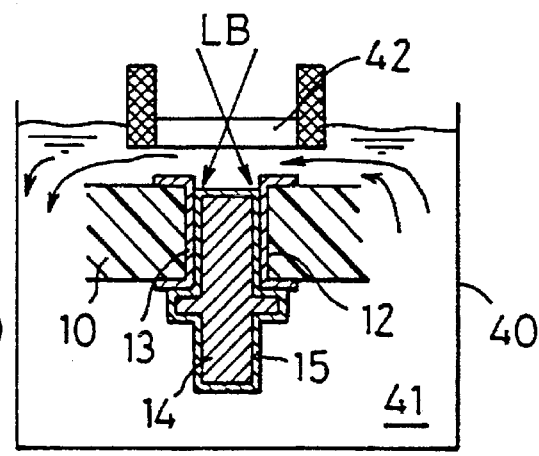

In another embodiment of FIG. 54 according to the present invention/the circuit board 10 with the lead terminal 14 mounted is dipped in a liquid 41 contained in a vessel 40, and the energy beam LB is irradiated from exterior position of the liquid and through the liquid to the thrust side tip end of the terminal 14, in the state where the scattering of sputter, vacuum metallizing or the like out of the welding part is prevented by means of the liquid. In another embodiment shown in FIG. 55, the energy beam LB is irradiated through a transparent plate 42 held by a proper supporter at surface level of the liquid 41 in the vessel 40 onto the circuit board 10 dipped in the liquid, so that the scattering of the sputter, vacuum metallizing or the like can be reliably and effectively restrained. For the liquid 41, $H_2O$, $H_2O$+alcohol ($CH_3OH$, $C_2H_5OH$) or the like may be employed. In addition to the prevention of contamination of the circuit board 10, the energy beam irradiation through the liquid in which the board is dipped is also effective to prevent the oxidation from occurring by means of an isolation of the welding parts from the atmosphere, and to perform a surface activity within the liquid 41 containing $CH_3OH$, so that the reliability of the joining can be remarkably improved. The surface activity of a plated Cu, for example, will be represented by $6CuO+C_2H_5OH+6Cu+2CO_2+3H_2O$. Other constituents and functions in the embodiments are the same as those in the foregoing embodiment of FIGS. 1 to 3.

Figure 56:
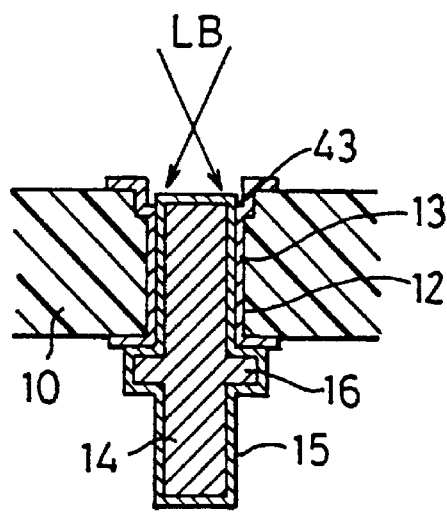
FIGS. 56 and 57, FIGS. 58 and 59, FIGS. 60 and 61 and FIGS. 62 and 63 are explanatory views for the mounting of the lead terminal in respective four further embodiments according to the present invention.
Figure 57:
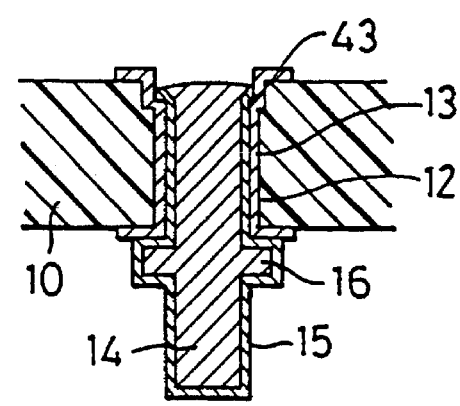
Figure 58:
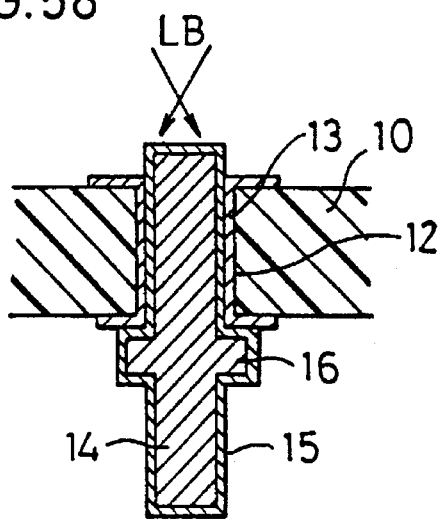
Figure 59:
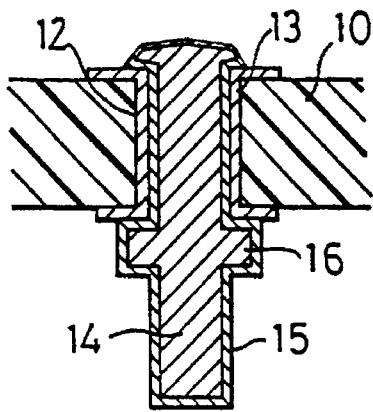

In another embodiment shown in FIG. 56 of the present invention, the through hole 12 is formed to have a radially expanded stepped part 43 at one opening where the thrust side tip end of the lead terminal 14 terminates, so that the irradiation of the energy beam LB will cause the tip end of the lead terminal 14 to be thermally deformed to ride on the stepped part 43 of the through hole 12, to be thus expanded over the circuit board 10 as shown in FIG. 57, and the lead terminal 14 is prevented from escaping out of the through hole 12 in the direction opposite to the thrusting direction. As in another embodiment of FIG. 58, further, the thrust side tip end of the lead terminal 14 may be slightly projected out of the surface of the circuit board 10, so as to expand over the circuit board 10 as shown in FIG. 59 as thermally deformed by the irradiation of the energy beam LB, whereby the lead terminal can be effectively prevented from escaping out of the through hole in the direction opposite to the thrusting direction. In the embodiment of FIGS. 58 and 59, other constituents and functions are the same as those in the foregoing embodiment of FIGS. 1 to 3.

Figure 60:
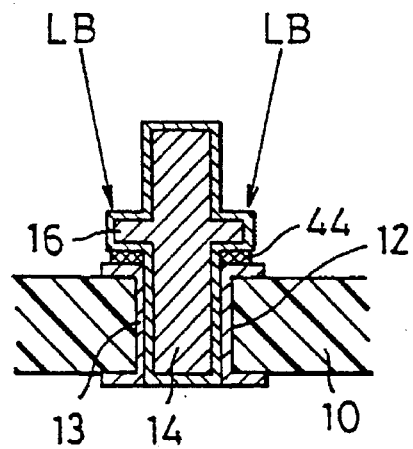
Figure 61:
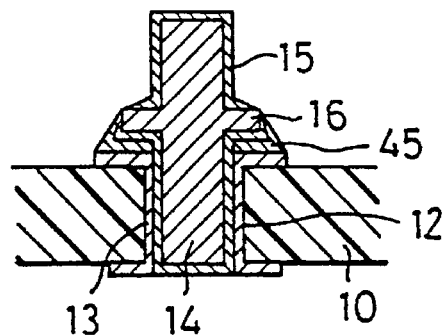

In another embodiment of FIG. 60 of the present invention, a ring-shaped solder 44 is interposed between the flange 16 of the lead terminal 14 and the opposing expanded part of the inner wall surface 13 of the through hole on the one surface of the circuit board 10 with which surface the thrust side tip end of the terminal is shown to be flush. With the irradiation of the energy beam LB with respect to the flange 16, there is formed a fillet 45 mainly between the flange 16 and the expanded part of the inner wall surface 13 as shown in FIG. 61, and the welding degree between the conductive inner wall surface 13 of the through hole 12 and the solder layer 15 of the lead terminal 14 can be further improved by this fillet 45. Other constituents and functions in the embodiment of FIGS. 60 and 61 are the same as those in the foregoing embodiment of FIGS. 1 to 3.

Figure 62:
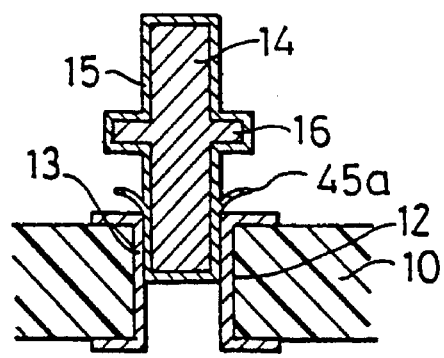
Figure 63:
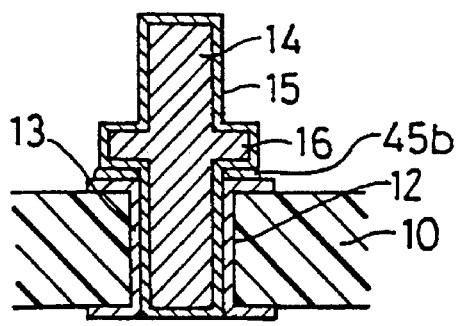

In another embodiment shown in FIGS. 62 and 63 employing also the lead terminal 14 of the type having the flange 16, the solder fins 45a yielded upon thrusting of the terminal into the through hole 12 of the circuit board 10 as shown in FIG. 62 are held between the flange 16 of the terminal and the expanded part of the conductive inner wall surface 13 so that, when the energy beam LB is irradiated with respect to the flange 16, the thus held fins are fused into a fillet 45b as shown in FIG. 63 so as to render the joining between the inner wall surface 13 of the through hole 12 and the solder layer 15 on the lead terminal 14 to be tightly intimate. In the embodiment of FIGS. 62 and 63, other constituents and functions are the same as those in the foregoing embodiment of FIGS. 1 to 3.

In another embodiment of the present invention as shown in FIG. 64, the lead terminal 14 has a modified type of flange 46 which is tapered on one surface on opposite side to the circuit board 10 to be thinner towards outer peripheral edge. In another embodiment of FIG. 65, the lead terminal 14 has a modified flange 47 stepped also on the opposite side to be thinner towards the peripheral edge. Preferably, the flange 46 or 47 is formed as slightly converged towards the axis of the lead terminal. Thus, as shown sequentially in FIGS. 66(a) to 66(c) with the modified flange 46 employed as an example, the thrusting of the lead terminal 14 into the through hole 12 of the circuit board 10 causes the converged peripheral edge of the flange 46 resiliently tightly engage the expanded part of the inner wall surface 13 of the through hole 12, and the irradiation of the energy beam LB causes heat to rise more easily at the peripheral edge part of the flange 46 so that a fused solder fillet 48 radially expanding from the flange 46 can be formed, and the electric connection between the lead terminal 14 and the conductive inner wall surface 13 can be sufficiently tightly achieved. With the tapered and inward converged formation of the flange as in FIG. 66(a), the pressure welding function in particular at the peripheral part of the flange can be increased. In the embodiments of FIGS. 64 and 65, other constituents and functions are the same as those in the foregoing embodiment of FIGS. 1 to 3.

In another embodiment shown in FIG. 67 of the present invention, the lead terminal 14 has another modified flange 49 which is sharply extended at outer peripheral edge part of the flange along the axial line of the terminal in a direction opposite to the thrusting direction. In another embodiment of FIG. 68, another modified flange 50 is similarly extended but with a slight additional thickness in radial direction. When the lead terminal 14 having such modified flange 49, for example, is mounted to the circuit board 10 as shown in FIG. 69 and the energy beam LB is irradiated to the flange 49 on its side opposite to the board and inside the extended paripheral edge, the beam can be concentrated to the terminal without scattering towards the circuit pattern on the circuit board 10, and the intended welding of the solder layer 15 of the terminal 14 to the conductive inner wall surface 13 can be optimumly realized. In the embodiments of FIGS. 67 and 68, other constituents and functions are the same as those in the foregoing embodiment of FIGS. 1 to 3.

Referring to the configuration of the lead terminal 14, from the view point of minimizing separately required step for treating the solder fins yielded upon the thrusting of the terminal into the through hole of the circuit board, there may be provided a variety of the configurations. Thus, FIGS. 70 and 71 show a type having a hemispherical thrust side tip end and a smaller diametered portion 51 adjacent to the flange 16 on the thrust side; FIG. 72 shows a type made hemispherical at both axial ends and having an intermediate small-diametered portion 52 between the tip end and the flange 16; FIG. 73 shows a type having a thrust side tip end tapered at corner edge while the other end is made cylindrical and an intermediate smaller diametered portion 52a between the tip end and the flange 16; FIGS. 74(a) and (b) show a type having a tapered thrust side tip end while the other end is cylindrical, intermediate small-diametered portion 53 between the tip end and the flange 16, and longitudinal grooves 54 made different in their circumferential position between both side portions of the intermediate small-diametered portion 53; FIGS. 75(a) and (b) show a type similar to that of FIG. 74 except for absence of the intermediate small-diametered portion 53, the both side portions different in the circumferential position of the longitudinal grooves 54 being thus continuous; FIG. 76 shows a type tapered at the thrust side tip end but made cylindrical at the other end and having multiple-stage partial spherical parts 55 between the tip end and the flange 16; FIG. 77 shows a type similar to that of FIG. 74 except that the longitudinal grooves 54 in both side portions of the small-diametered portion 56 are at the same circumferential position; FIGS. 78, 79(a) and 79(b) show a type made hemispherical at both ends and having on the thrust side between the tip end and the flange 16 a spiral groove 57 conformable to a spiral member 58; FIG. 80 shows a type made hemispherical at both ends and having a plurality of spiral grooves 59 between the thrust side tip end and the flange 16; FIG. 81 shows a type made hemispherical at both ends and having a single spiral rib 60 between the thrust side tip end and the flange 16; and FIG. 82 shows a type made hemispherical at both ends and having a plurality of spiral ribs 61 between the thrust side tip end and the flange 16. Among these various types of the lead terminal, any proper one or more of the types may be employed with respect to each circuit board. In these various types of the lead terminal 14, as will be readily appreciated, the solder fins yielded between the grooves or ribs are cut into small pieces and held by the flange 16 and, in addition, the joining between the conductive inner wall surface 13 of the through hole 12 and the lead terminal 14 is increased in the close tightness, so that the lead terminal 14 can be mounted to the circuit board 10 with a highly reliable electric contactability.

In another embodiment shown in FIGS. 83(a) and 83(b) of the present invention, the lead terminal 14 is provided on one side of the flange 16 facing the circuit board 10 with a relative deep annular recess for receiving the solder fins 62 yielded upon thrusting the terminal into the through hole 12 of the circuit board 10. Any solder fins 62 which projecting out of the recess 63 are kept as held between the circuit board 10 and peripheral edge part of the flange 16 as shown in FIG. 84 and, upon irradiation of the energy beam LB onto outer side of the flange 16 as shown in FIG. 85(a), these projecting fins 62 are fused and made to function as a welded part 64 between the board 10 and the lead terminal 14 as shown in FIG. 85(b) as solidified after interruption of the energy beam LB.

In another embodiment shown in FIGS. 86 and 87, the lead terminal 14 is tapered at the thrust side tip end and made cylindrical at the other end, ribs 65 mutually separated in circumferential direction are provided on the periphery between the tapered tip end and the flange 16 to extend in axial direction of the terminal, and radial sector-shaped grooves 65a respectively continuing to each of the ribs 65 are provided in side surface of the flange 16. In this case, as shown in FIGS. 88(a) to 88(c), the solder fins 66 yielded by the ribs 65 upon thrusting of the terminal 14 into the through hole 12 of the circuit board 10 are received in the grooves 65a of the flange 16 so that the flange 16 of the terminal can be brought into intimate engagement with opposing surface of the circuit board 10, without any substantial clearance between them.

In the above embodiments of FIGS. 70 and 71, FIGS. 72 to 77, FIGS. 78 and 79, FIGS. 80 to 82, FIGS. 83 to 85, and FIGS. 86 to 88, all other constituents and functions are the same as those in the foregoing embodiment of FIGS. 1 to 3.

Figure 89:
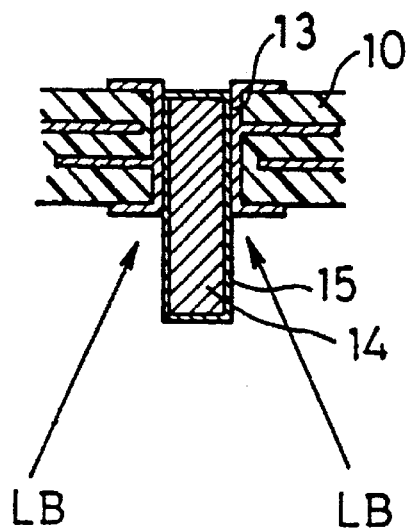
FIGS. 89 to 92 are explanatory views for the mounting of the lead terminal in respective further embodiments according to the present invention.
Figure 90:
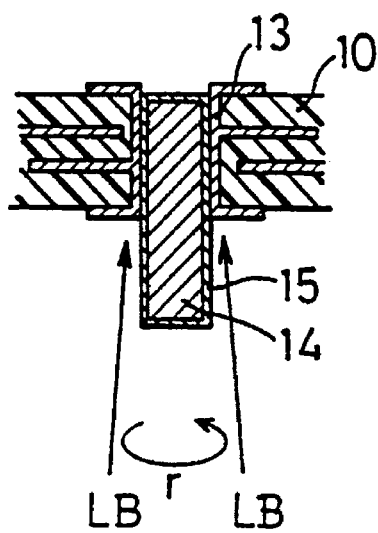
Figure 91:
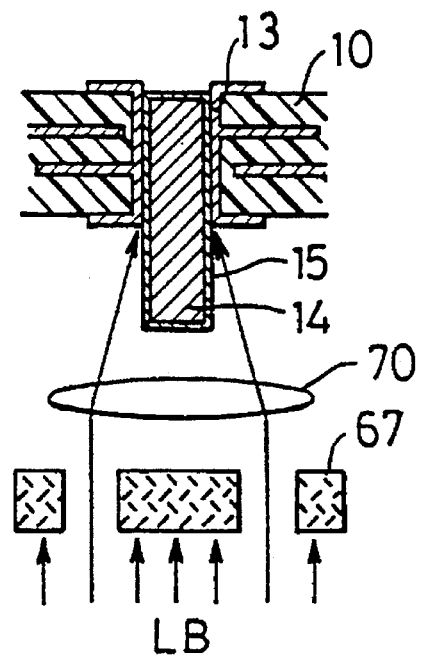
Figure 92:
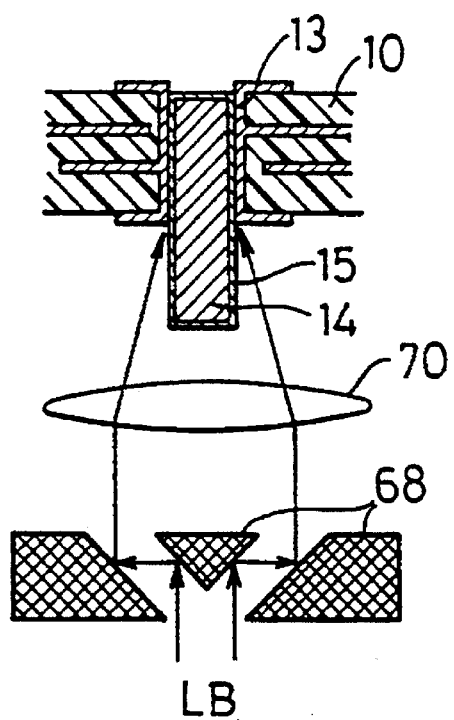

In another embodiment shown in FIG. 89 of the present invention, the energy beam LB is irradiated with respect to the lead terminal 14 mounted to the circuit board 10 from diagonally outer side to the terminal on its side projecting out of the board 10, to obtain the same function as that referred to with reference to the foregoing embodiments. Further, as shown in FIG. 90, the energy beam LB is irradiated with respect to the lead terminal 14 mounted to the circuit board 10 as rotated about the axis of the lead terminal in a direction "r" and the energy can be provided at a high efficiency. As shown in FIG. 91, further, it is optimum to provide the energy beam LB in an annular shape through a light projecting path including a mask member 67 and a prism, so as to provide the energy concentratively to the welding part between the inner wall surface 13 of the circuit board 10 and the lead terminal 14. In this case, as shown in FIG. 92, it is possible to realize the annular shape energy beam LB in the case of FIG. 91 by means of a light projecting path including a prism and reflector mirror arrangement 68 and a lens 70. In these embodiments of FIGS. 91 and 92, in particular, it is possible to effectively prevent any irradiation of the energy beam LB to any part the energy provision to which is not advantageous. Other constituents and functions in these embodiments of FIGS. 89 to 92 are the same as those in the foregoing embodiment of FIGS. 1 to 3.

Figure 93:
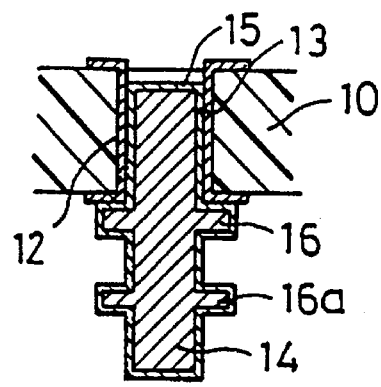
FIG. 93 is a magnified fragmentary sectioned view of the circuit board with the lead terminal in another embodiment mounted thereto according to the present invention.
Figure 94:
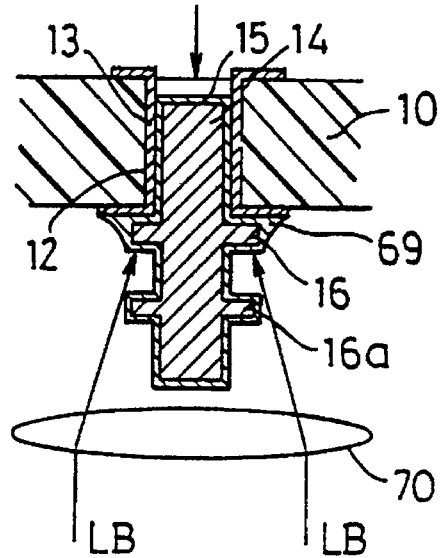
FIGS. 94 and 95 are explanatory views for the mounting of the lead terminal of FIG. 92, respectively in different aspects of the present invention.
Figure 95:
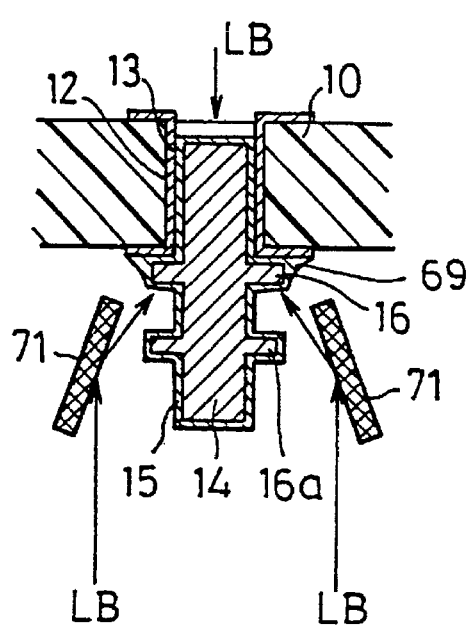

In another embodiment of FIG. 93 according to the present invention, the lead terminal 14 is provided with double flanges 16 and 16a in which, while the first flange 16 is used as has been described for positioning and reliable welding of one thrust side tip end to the circuit board 10 as shown, the second flange 16a is employable for the same purpose of positioning and reliable welding of the other end of the same lead terminal with respect to a further circuit board (not shown). In irradiating the energy beam LB with respect to the first flange 16, it is possible to provide the energy exclusively to the first flange 16 with such mask member 67 as in the embodiment of FIG. 91 utilized at exterior position of the second flange 16a as shown in FIG. 94, without affecting the latter at all. As another measure for the exclusive provision of the energy to the first flange 16 without affecting the second flange 16a, it is effective also to employ the lens 70 or reflection mirrors 71 by disposing them outside the second flange 16a, as shown in FIG. 95, to deflect the energy beam LB irradiated around the second flange 16a towards the first flange 16. As also shown in FIGS. 94 and 95, it is desirable to irradiate the energy beam LB not only on the side of the flange 16 but also concurrently on the other side of the through hole 12 where the thrust side tip end of the lead terminal 14 appears. As also shown in FIGS. 94 and 95, it is also possible to form a fillet 69 across outer peripheral edge of the first flange 16 and the opposing side surface of the circuit board 10, in particular, the expanded part of the inner wall surface 13 of the through hole 12. In the embodiments of FIGS. 93 and 94 and FIG. 95, other constituents and functions are the same as those in the foregoing embodiment of FIGS. 1 to 3.

Figure 96:
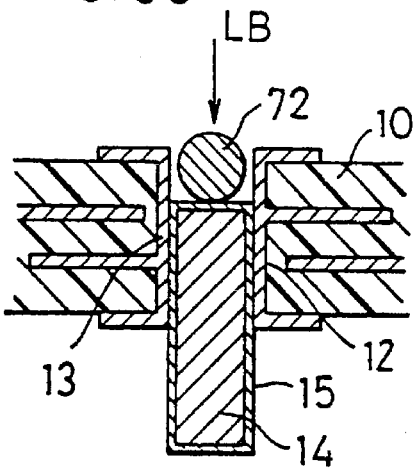
FIG. 96 is a magnified fragmentary sectioned view of the circuit board with the lead terminal in still another embodiment mounted thereto according to the present invention.
Figure 97:
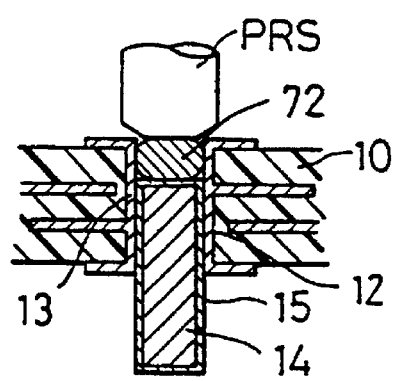
FIGS. 97 and 98 are explanatory views for the mounting of the lead terminal of FIG. 96.
Figure 98:
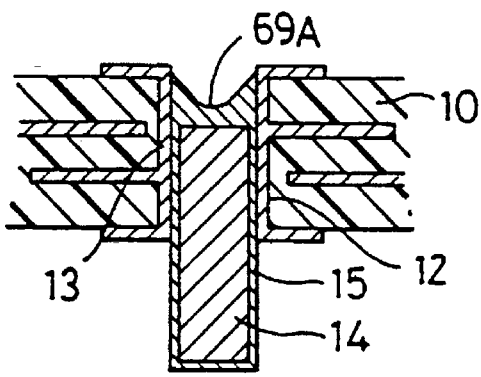

In another embodiment shown in FIGS. 96 to 98, the lead terminal 14 is mounted to the circuit board 10 with the thrust side tip end positioned as retracted inside the through hole 12, a solder ball 72 is placed on the retracted tip end of the terminal inside the through hole and, after Crushing if required this solder ball 71 by the pressure machine PRS as shown in FIG. 97, the energy beam LB is irradiated on the side of this solder ball 72, so that a relatively large solder fillet 69A can be formed in the through hole 12 on the retracted tip end of the lead terminal 14 as shown in FIG. 98 and thus the welding degree of the lead terminal 14 to the circuit board 10 can be remarkably elevated. In this embodiment of FIGS. 96 to 98, other constituents and functions are the same as those in the embodiment shown in FIGS. 1 to 3.

Figure 99:
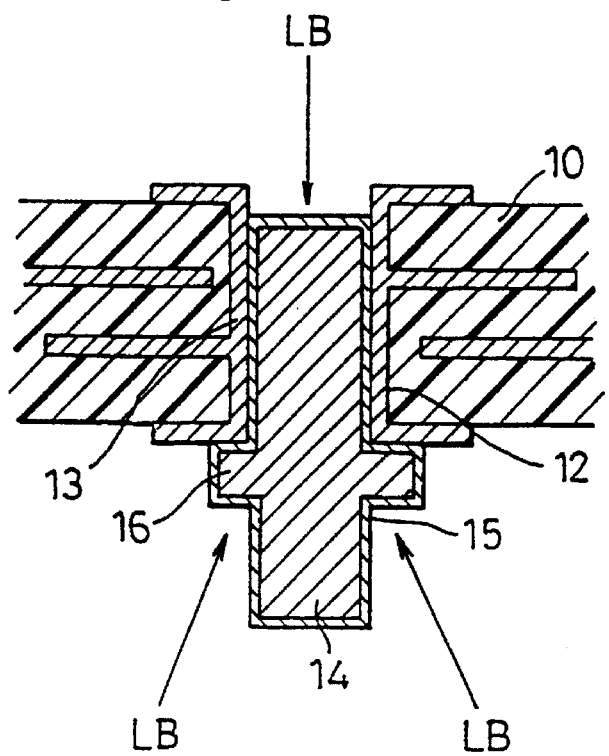
FIG. 99 is an explanatory view for the mounting of the lead terminal in another embodiment according to the present invention.
Figure 100:
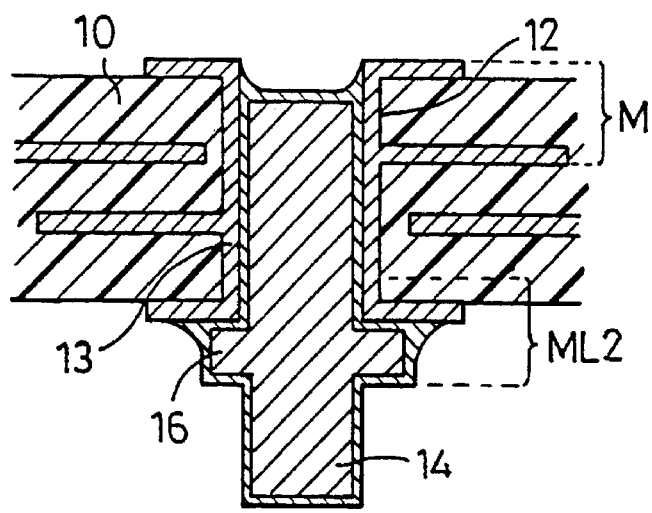
FIG. 100 is an explanatory view for the mounting of the lead terminal in the embodiment of FIG. 99.

As shown in FIG. 99, further, it is also possible to employ such concurrent energy beam irradiation from both sides of the through hole 12 of the circuit board 10 as described with reference to FIGS. 93 to 95 in the foregoing embodiments in which the lead terminal 14 having the single flange 16 is mounted to the circuit board 10, so that the welding between the inner wall surface 13 of the through hole 12 and the lead terminal 14 can be realized in a relatively short time and in manner extremely excellent. In this case, as will be readily appreciated when FIG. 100 is also referred to, the energy beam irradiation on the side of the thrust tip end of the lead terminal 14 in the through hole 12 attains the welding between both solder layers of the through hole 12 and lead terminal 14 substantially to an extent ML1 while the irradiation on the other side of the flange 16 of the lead terminal 14 attains the welding between both solder layers of the through hole 12 and lead terminal 14 around the flange 16 substantially to an extent ML2, so that both solder layers of the through hole 12 and lead terminal 14 can be controllably partially welded without being welded throughout the whole engaging area between the through hole 12 and the lead terminal 14. With this arrangement allowing the solder layers of the through hole 12 and lead terminal 14 to be partially melt and joined at portions adjacent to incident area of the energy beams LB, it is enabled to effectively prevent the molten solder from leaking out of the through hole 12. In the present instance of FIGS. 99 and 100, other constituents and functions are the same as those in the foregoing embodiment of FIGS. 1 to 3.

Figure 101:
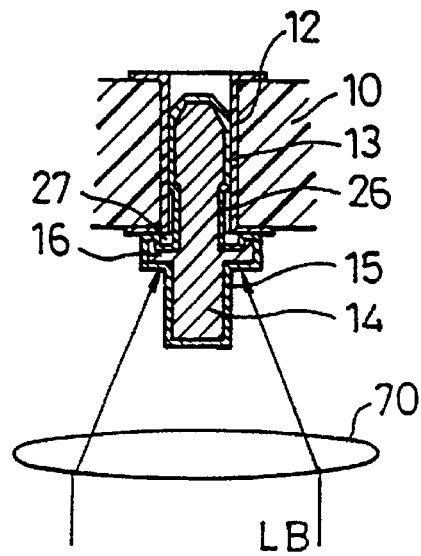
FIGS. 101 to 110 are explanatory views for the mounting of the lead terminal in still other embodiments according to the present invention.
Figure 101A:
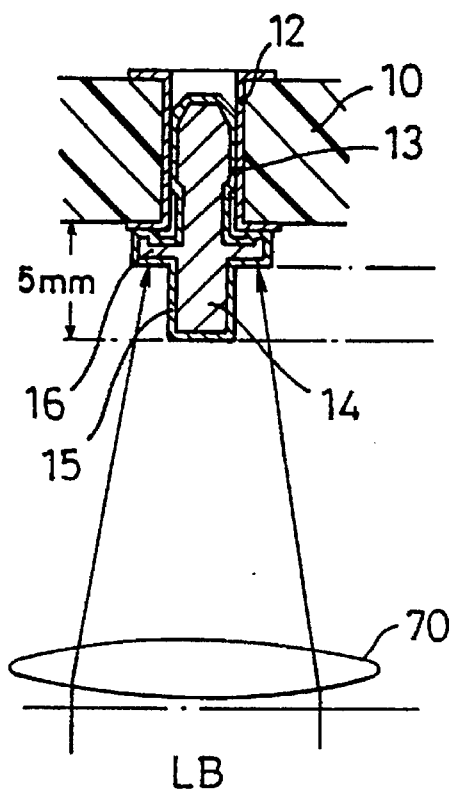
Figure 101B:
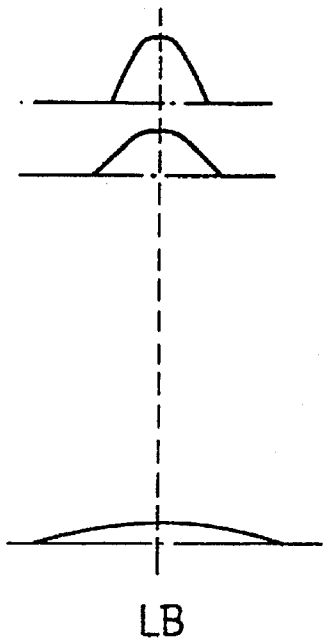
Figure 101C:
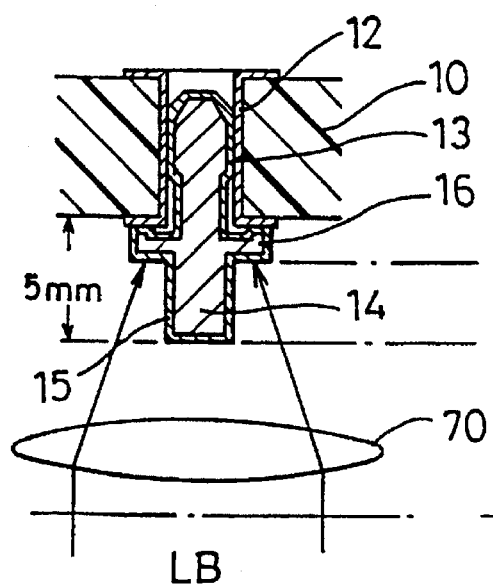
Figure 101D:
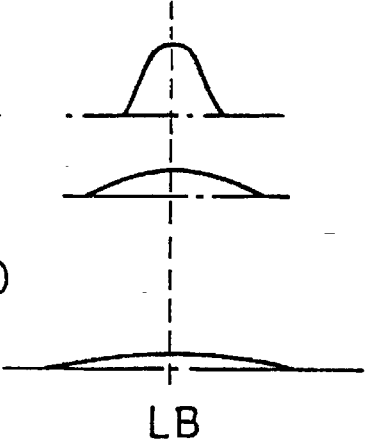

In irradiating the energy beam LB in the respective embodiments described above, it is desirable to carry out the irradiation with such optical means comprising the lens 70 as shown in FIG. 101 interposed. When the optical means of FIG. 101 is employed under conditions where the lead terminal 14 has a diameter of 0.5 mm and is extended by 5 mm out of the circuit board 10 and the lens 72 is of a relatively low numerical aperture NA, then the energy density irradiated upon extended end of the lead terminal 14 is made high so as to render the extended end of the terminal to be easily damageable. When on the other hand the lens 72 of a relatively high NA is employed, it is possible to lower the energy density at the extended end of the lead terminal 14 and to reliably restrain the damage of the extended end and its neighborhood. More specifically, the use of the lens 70 of a long forcal length and less than 0.5 NA as shown in FIG. 101A, for example, may cause such thermal damage to be likely to occur that the heat input amount to the exposed side end of the lead terminal 14 becomes large in addition to an increased heat input to non-welding zone adjacent to the flange 16, the energy density in the center of the exposed side end of the lead terminal 14 is increased enough for causing the exposed side end of the terminal 14 to be melted to deform, and so on. When, on the other hand, the lens 70 of a short forcal length and more than 0.75 NA is employed as shown in FIG. 101B, the heat input to the exposed side end of the terminal 14 decreases and, accompanying thereto, the energy density in the center of the exposed side end of the terminal also decreases, so that such thermal damage as melting deformation of the lead terminal 14 can be effectively prevented.

Figure 102:
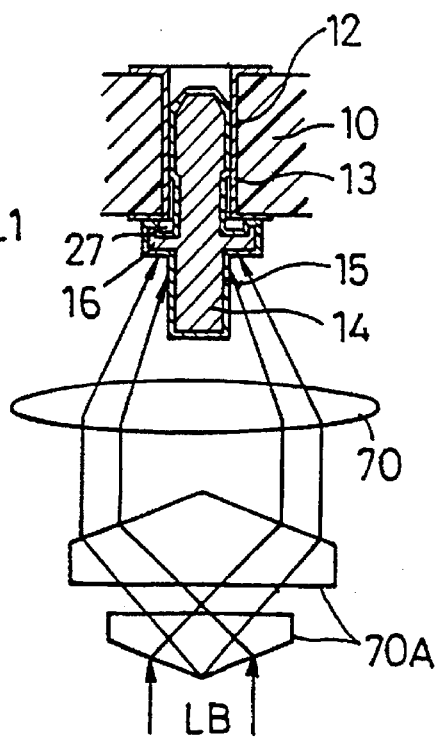

In irradiating the energy beam LB with the arrangement of FIG. 102 employed, the optical means comprises a pair of the prisms 72b and 72c for rendering the energy beam LB to be annular, and the lens 72a for converging the annular beam to be smaller in the diameter so as to be incident diagonally upon the flange 16. In this case, the annular energy beam irradiation can be realized by employing an arrangement including a YAG laser with a modification of columnar YAG rod into a doughnut-shape in section, an arrangement of the YAG laser including the columnar YAG rod and a resonance mirror rendered to be annular, an arrangement of $CO_2$ laser and an instable resonance oscillator utilized for obtaining annular laser beam, or the like arrangement, and any beam irradiation with respect to the lead terminal at any undesirable portion can be reduced.

Figure 103:
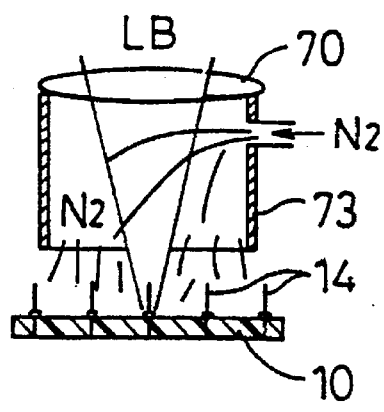
Figure 104:
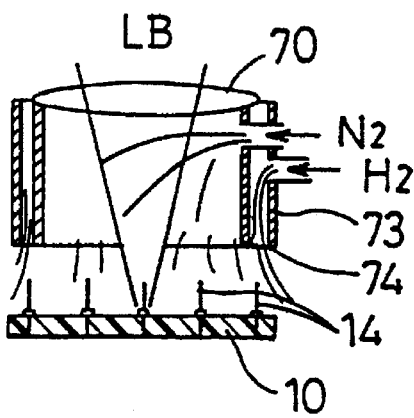

While the description has been made to the arrangement for improving the weldability by preventing the oxidation with the inert gas supplied upon welding the lead terminal 14 thrust into the through hole 12 of the circuit board 10 with reference to FIGS. 36 and 37, the energy beam LB is irradiated in practice through such lens 72 as shown in FIG. 103 while supplying the inert gas of $N_2$ through a tubular nozzle means 73. In this case, it is preferable to blow the inert gas against the respective lead terminals 14 mounted to the circuit board 10 at a rate of 5 to 100 l/min. when the nozzle means is made to be of a diameter of 10 to 100 mm. According to this arrangement of FIG. 103, the inert gas can be blown against the circuit board 10 while isolating the gas from environmental atmosphere by the nozzle means 73, with any involving of the atmosphere in the inert gas blow minimized. In addition, as shown in FIG. 104, it is also possible to provide to the nozzle 73 a peripheral wall 74 to define a relatively larger inner blow path and a relatively smaller outer peripheral blow path so that, while the inert gas such as $N_2$ gas is supplied to the inner blow path to be blown against the lead terminals 14 on the circuit board 10, such reduction component as $H_2$ gas is supplied through the outer peripheral blow path to peripheral zone of the board together with the irradiation of the energy beam LB, whereby a reducing action by means of $H_2$ gas is added to the minimization of involved atmosphere into the $N_2$ gas blow, so that the oxidation of the solder layers of the through holes 12 and lead terminals 14 can be prevented, and the weldability between them can be remarkably improved.

Figure 105:
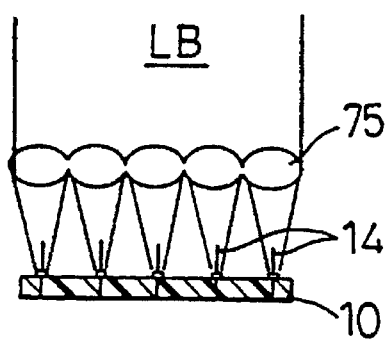
Figure 106:
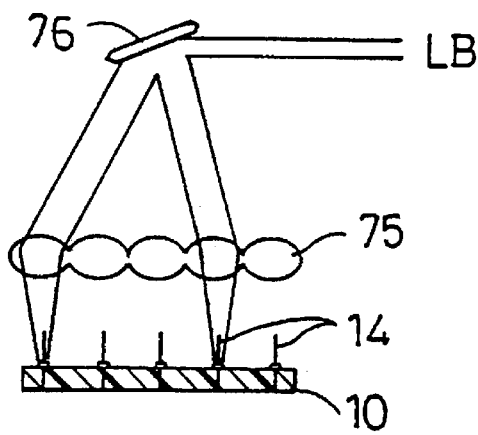
Figure 107:
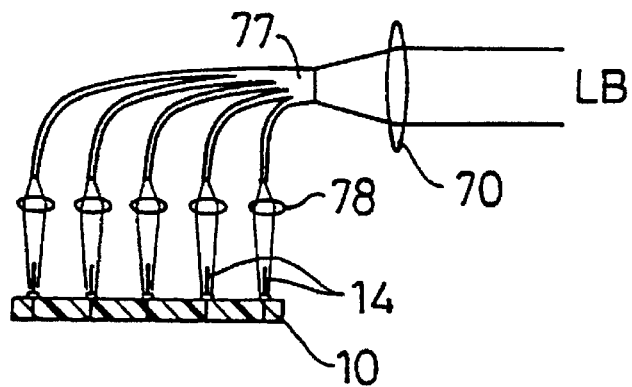

In another embodiment shown in FIG. 105 according to the present invention, the energy beam LB is provided to be concurrently irradiated to a plurality of the lead terminals 14 on the circuit board 10 by means of a multifocusing lens 75. In this case, the lens 75 may be replaced by a plurality of single focal lenses subjected to an X-Y control for irradiating a plurality of the lead terminals 14, which X-Y control may be executed with any commonly employed X-Y controllers. Further, such deflecting means as an X-Y galvanomirror 76 may be additionally employed as shown in FIG. 106 to distribute the energy beam LB sequentially to the respective lead terminals 14 through the multifocusing lens 75. Further, as shown in FIG. 107, the energy beam LB can be irradiated concurrently to the respective lead terminals 14 on the circuit board 10 through the lens 70, glass fibers 77 respectively receiving the beam condensed by the lens 72 concurrently at one end and transmitting the beam at the other acting end to each of condensers 78 for condensing the beam to every lead terminal 14. In these embodiments of FIGS. 103 to 107, other constituents and functions are the same as those in the embodiment of FIGS. 1 to 3.

Figure 108:
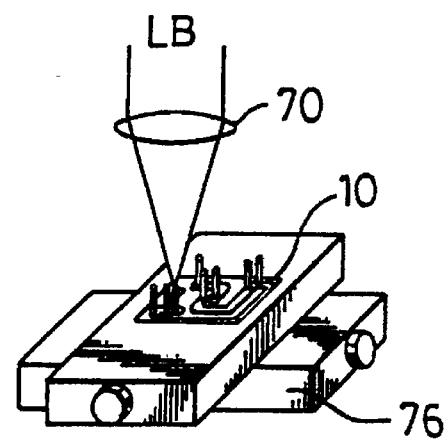
Figure 109:
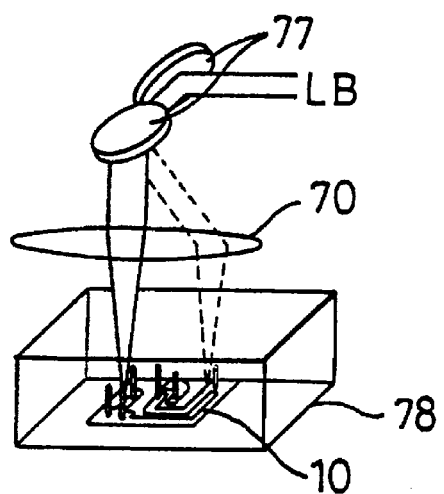
Figure 110:
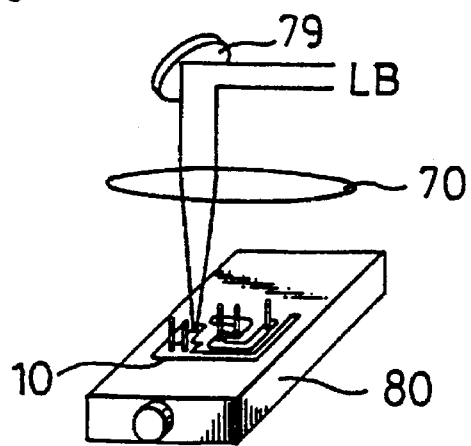

In another embodiment of the present invention as shown in FIG. 108, on the other hand, the arrangement is so made as to irradiate the energy beam LB through the single lens 70, the circuit board 10 carrying a plurality of the lead terminals 14 thrust into the respective through soles is placed on an X-Y table 79 capable of being X-Y controlled at a high speed, the beam LB is irradiated sequentially to the respective lead terminals at the high speed, and the mounting of the lead terminals 14 can be optimumly executed. In a further embodiment shown in FIG. 109, the high speed irradiation of the energy beam LB is carried out with such deflector means as the X-Y galvanomirror 80 as well as the single lens 70 with respect to many lead terminals 14 thrust into the through holes of the circuit board 10, for their optimum mounting to the board, in which case the circuit board 10 carrying the thrust lead terminals should preferably be placed within a transparent casing 81 while such inert gas as $N_2$, Ar, He or the like is supplied therein, so that the lead terminals 14 can be prevented from being oxidized, and the mounting of the terminals to the circuit board 10 can be executed while improving the weldability. In still another embodiment of FIG. 110, and X or Y galvanomirror 82 is employed as combined with a Y or X table 83, the circuit board 10 carrying many thrust lead terminals 14 is placed on the table 83, the high speed irradiation of the energy beam LB is carried out with respect to the terminals with the single lens 70 interposed, and the lead terminals 14 can be mounted to the circuit board 10. In these embodiments of FIGS. 108 to 110, all other constituents and functions are the same as those in the foregoing embodiment of FIGS. 1 to 3.

What is claimed is:

1. A terminal-carrying circuit board structure comprising a circuit board and terminals installed therein, the circuit board including through-holes formed therein for the installation of respective terminals, each through-hole including a conductive inner wall surface having a first pre-installation lining of solder formed thereon, each terminal including first and second ends, said first end having a second pre-installation lining of solder formed thereon, said first and second pre-installation linings forming respective first and second tightly contacting lining surfaces each being scratched in response to installation of the terminal first part into its respective through hole, said first and second lining surfaces being thermally joined together by energy beam irradiation.

2. The terminal-carrying circuit board structure according to claim 1, wherein each of the through holes includes first and second ends, said first end defining a terminal-inlet end into which a leading end of a respective terminal is inserted, each terminal including a flange having a stop surface facing said terminal inlet end to limit an extent of installation of said terminal into its respective through hole.

3. The circuit board structure according to claim 1, wherein said terminals respectively have an end thereof formed for causing a multipath reflection of said energy beam irradiated thereon.

4. The circuit board structure according to claim 1, wherein said terminals respectively have recesses and projections at an end thereof which is irradiated by said energy beam for causing a multipath reflection of said energy beam.

5. The circuit board structure according to claim 2, wherein said terminals respectively have longitudinal recesses and projections at an end thereof which is irradiated by said energy beam and radial recesses and projections at said flange and corresponding to said longitudinal recesses and projections.

6. The circuit board structure according to claim 2, wherein said flange of each terminal extends laterally outwardly from a central part of the terminal, an outer peripheral of said terminal being thinner than said central part.

7. A multi-layer, terminal-carrying circuit board structure, comprising a plurality of circuit boards and terminals installed therein, said circuit boards being provided with circuit patterns including interlayer circuit patterns and with through holes formed through respective circuit patterns, each through hole having a first pre-installation lining of solder covering an inner peripheral wall thereof and connected to the circuit pattern, each of said through holes including first and second ends, said first end defining a terminal-inlet end into which a leading end of a respective terminal is inserted, each terminal including a flange having a stop surface facing said terminal inlet end to limit an extent of installation of said terminal into its respective through hole, each terminal including its flange being covered by a second pre-installation lining of solder, said first and second pre-installation linings forming respective first and second tightly contacting surfaces each being scratched in response to installation of the terminal into its respective through hole, said first and second scratched lining surfaces being thermally joined together by energy beam irradiation.

* * * * *